US007561987B2

(12) United States Patent
Nakayama et al.

(10) Patent No.: US 7,561,987 B2
(45) Date of Patent: Jul. 14, 2009

(54) NETWORK ANALYZER, NETWORK ANALYZING METHOD, PROGRAM, AND RECORDING MEDIUM

(75) Inventors: Yoshikazu Nakayama, Tokyo (JP); Takeshi Tanabe, Tokyo (JP)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/598,201

(22) PCT Filed: Feb. 10, 2005

(86) PCT No.: PCT/JP2005/002511

§ 371 (c)(1),
(2), (4) Date: Oct. 5, 2006

(87) PCT Pub. No.: WO2005/080999

PCT Pub. Date: Sep. 1, 2005

(65) Prior Publication Data

US 2007/0143051 A1    Jun. 21, 2007

(30) Foreign Application Priority Data

Feb. 23, 2004    (JP)    ............................. 2004-046084

(51) Int. Cl.
*G06F 3/00* (2006.01)
(52) U.S. Cl. ....................... 702/185; 702/182; 702/183; 702/186
(58) Field of Classification Search .................... 702/85, 702/104, 106, 107, 189–191, 182, 183, 185, 702/186; 324/500; 370/347; 375/259
See application file for complete search history.

(56) References Cited

U.S. PATENT DOCUMENTS 6,188,968 B1    2/2001    Blackham .................... 702/85

(Continued)

FOREIGN PATENT DOCUMENTS

JP    11-038054    2/1999

(Continued)

OTHER PUBLICATIONS

Nakayama et al., Network Analyzer, Network Analyzing Method, Automatic Corrector, Correcting Method, Program, and Recording Medium, 2003, English translation from Japanese, pp. 1-68—JP 03/087856 A1 (2003).*

(Continued)

*Primary Examiner*—Eliseo Ramos Feliciano
*Assistant Examiner*—Felix E Suarez
(74) *Attorney, Agent, or Firm*—Fitzpatrick, Cella, Harper & Scinto

(57) ABSTRACT

Errors of a measuring system are corrected by acquiring the phases of transmission tracking errors. A network analyzer includes a measuring system error factor recording unit which records measuring system error factors generated independently of frequency conversion carried out by a DUT, and an error factor acquiring unit which measures first coefficients and second coefficients of a correction mixer where a signal output from a terminal is a sum of a product of a signal input to the terminal and the first coefficient, and a product of a signal input to the other terminal and the second coefficient, and the ratio of magnitudes of the second coefficients is constant, and acquires the transmission tracking errors caused by the frequency conversion based on the measuring system error factors recorded in the measuring system error factor recording unit, the first coefficients, and the second coefficients.

19 Claims, 28 Drawing Sheets

U.S. PATENT DOCUMENTS

| | | | |
|---|---|---|---|
| 6,496,785 B1 * | 12/2002 | Nakayama et al. | 702/117 |
| 6,995,571 B1 | 2/2006 | Liu et al. | 324/601 |
| 2005/0165570 A1 | 7/2005 | Wakai | 702/85 |
| 2005/0289392 A1 * | 12/2005 | Haruta et al. | 714/14 |
| 2006/0005065 A1 * | 1/2006 | Nakayama et al. | 714/4 |
| 2007/0029989 A1 * | 2/2007 | Haruta et al. | 324/76.22 |

FOREIGN PATENT DOCUMENTS

| | | |
|---|---|---|
| JP | 11-352163 | 12/1999 |
| JP | 2003-294820 | 10/2003 |
| JP | WO 03/087856 A1 * | 10/2003 |
| WO | 03/083907 | 10/2003 |
| WO | 03/087856 | 10/2003 |

OTHER PUBLICATIONS

English Language Abstract of JP 2003-294820.
English Language Abstract of JP 11-352163.
English Language Abstract of JP 11-038054.
U.S. Appl. No. 10/599,124 to Nakayama et al., filed Sep. 20, 2006.
U.S. Appl. No. 10/572,381 to Haruta et al., filed Mar. 16, 2006.
U.S. Appl. No. 11/568,873 to Haruta et al., filed Nov. 9, 2006.

* cited by examiner

[REV Mode]

NETWORK ANALYZER, NETWORK ANALYZING METHOD, PROGRAM, AND RECORDING MEDIUM

TECHNICAL FIELD

The present invention relates to a network analyzer used to calculate and measure circuit parameters of a device under test.

BACKGROUND ART

There has conventionally been practiced measurement of circuit parameters (such as the S parameters) of a device under test (DUT). A description will now be given of the measurement method of the circuit parameters of a device under test (DUT) according to the prior art with reference to FIG. 25.

A signal at frequency f1 is transmitted from a signal source 110 to a receiving unit 120 via a DUT 200. The signal is received by the receiving unit 120. It is assumed that the frequency of the signal received by the receiving unit 120 is f2. It is possible to acquire the S parameters and frequency characteristics of the DUT 200 by measuring the signal received by the receiving unit 120.

On this occasion, measuring system errors are generated in the measurement due to mismatching between a measuring system such as the signal source 110 and the DUT 200, and the like. These measuring system errors include Ed: error caused by the direction of a bridge, Er: error caused by frequency tracking, and Es: error caused by source matching. FIG. 26 shows a signal flow graph relating to the signal source 110 if the frequency f1=f2. RF IN denotes a signal input from the signal source 110 to the DUT 200 and the like, S1im denotes an S parameter of the DUT 200 and the like acquired based on a signal reflected from the DUT 200 and the like, and S1a denotes a true S parameter of the DUT 200 and the like without the measuring system errors.

If the frequency f1=f2, the errors can be corrected in a manner described in a patent document 1 (Japanese Laid-Open Patent Publication (Kokai) No. H11-38054), for example. The correction in this way is referred to as calibration. A brief description will now be given of the calibration. A calibration kit is connected to the signal source 110 to realize three types of states: open circuit, short circuit, and load (standard load Z0). In these states, a signal reflected from the calibration kit is acquired by a bridge to acquire three types of the S parameter (S11m) corresponding to the three types of states. The three types of variable Ed, Er and Es are acquired from the three types of the S parameter.

However, the frequency f1 may not be equal to the frequency f2. For example, the DUT 200 may be a device providing a frequency conversion function such as a mixer. FIG. 27 shows a signal flow graph relating to the signal source 110 if the frequency f1 is not equal to the frequency f2. Though Ed and Es are the same as those of the case where the frequency f1 and the frequency f2 are equal to each other, the Er is divided into Er1 and Er2. Since the calibration as described in the patent document 1 acquires only the three types of S parameter (S11m), only Ed, Es, and Er·Er2 can be acquired. Thus, Er1 and Er2 cannot be acquired.

Moreover, if the frequency f1 and the frequency f2 are not equal to each other, measuring system errors due to the receiving unit 120 are not negligible. FIG. 28 shows a signal flow graph if the signal source 110 and the receiving unit 120 are directly connected with each other S21m denotes an S parameter of the DUT 200 and the like acquired based on a signal received by the receiving unit 120. As shown in FIG. 28, there are generated measuring system errors Et and EL caused by the receiving unit 120. These errors cannot be acquired by the calibration as described in the patent document 1.

Therefore, if the frequency f1 is not equal to the frequency f2, the errors are corrected as described in a patent document 2 (WO 03/087856, Pamphlet). First, three types of calibration kits (open circuit, short circuit, and load (standard load Z0)) are connected to a signal source. This is the same as the method described in the patent document 1, and Ed, Es, and Er1·Er2 can thus be acquired. The signal source is then connected to a power meter. Based on a result measured by the power meter, Er1 and Er2 can be acquired (refer to FIG. 6 and FIG. 7 in the patent document 2). Further, the signal source and a receiving unit are directly connected with each other, and Et and EL can be acquired based on a measured result on this occasion (refer to FIG. 8 and FIG. 9 in the patent document 2).

It should be noted that the transmission tracking error is defined as Er1·Et. According to the method described in the patent document 2, Er1 and Et can be measured, and the transmission tracking error Er1·Et thus can be acquired.

However, when the transmission tracking error Er1·Et is acquired according to the method described in the patent document 2, it is necessary to use a power meter to measure Er1. Since the power meter is used, it is not possible to acquire the phase of the transmission tracking error.

An object of the present invention is to correct errors of a measuring system so as to acquire the phases of the transmission tracking errors.

DISCLOSURE OF THE INVENTION

According to the present invention, a network analyzer includes: a measuring system error factor recording unit that records a measuring system error factor generated independently of a frequency conversion by a device under test; a correction coefficient output unit that outputs measured first coefficients and second coefficients of a correction frequency converting element wherein a signal output from one terminal is represented as a sum of a product of a signal input to the terminal and the first coefficient and a product of a signal input to the other terminal and the second coefficient, and a ratio of the magnitudes of the second coefficients is constant; and a transmission tracking error acquiring unit that acquires a transmission tracking error generated by the frequency conversion based on the measuring system error factor recorded in the measuring system error factor recording unit, and the first coefficients and the second coefficients output by the correction coefficient output unit.

According to the thus constructed invention, a measuring system error factor recording unit records a measuring system error factor generated independently of a frequency conversion by a device under test. A correction coefficient output unit outputs measured first coefficients and second coefficients of a correction frequency converting element wherein a signal output from one terminal is represented as a sum of a product of a signal input to the terminal and the first coefficient and a product of a signal input to the other terminal and the second coefficient, and a ratio of the magnitudes of the second coefficients is constant. A transmission tracking error acquiring unit acquires a transmission tracking error generated by the frequency conversion based on the measuring system error factor recorded in the measuring system error factor recording unit, and the first coefficients and the second coefficients output by the correction coefficient output unit.

According to the present invention, it is preferable that if the first coefficients are M11' and M22', the second coefficients are M12' and M21', a signal input to a first terminal is a1, a signal output from the first terminal is b1, a signal input to a second terminal is a2, and a signal output from the second terminal is b2 in the correction frequency converting element, $b1 = M11' \times a1 + M12' \times a2$ $b2 = M21' \times a1 + M22' \times a2$, and $|M12'|/|M21'|$ is constant.

According to the present invention, it is preferable that the magnitudes of the second coefficients are the same for either of the terminals.

According to the present invention, it is preferable that the network analyzer further includes: an input signal measuring unit that measures an input signal parameter relating to an input signal input to the device under test before the measuring system error factor is generated; a plurality of ports that are connected to a terminal of the device under test, and output the input signal; and a device-under-test signal measuring unit that measures a device-under-test signal parameter relating to a device-under-test signal input from the terminal of the device under test to the port.

According to the present invention, it is preferable that the correction coefficient output unit acquires the first coefficients and second coefficients of the correction frequency converting element according to a ratio of the input signal parameter measured by the input signal measuring unit and the device-under-test signal parameter measured by the device-under-test signal measuring unit.

According to the present invention, it is preferable that the transmission tracking error acquiring unit acquires the transmission tracking error based on a ratio of error factors generated in a passage from the device-under-test signal being output from the terminal of the device under test without the frequency conversion to the device-under-test signal being received by the device-under-test signal measuring unit.

According to the present invention, a network analyzing method includes: a measuring system error factor recording step of recording a measuring system error factor generated independently of a frequency conversion by a device under test; a correction coefficient output step of outputting measured first coefficients and second coefficients of a correction frequency converting element wherein a signal output from one terminal is represented as a sum of a product of a signal input to the terminal and the first coefficient and a product of a signal input to the other terminal and the second coefficient, and a ratio of the magnitudes of the second coefficients is constant; and a transmission tracking error acquiring step of acquiring a transmission tracking error generated by the frequency conversion based on the measuring system error factor recorded in the measuring system error factor recording step, and the first coefficients and the second coefficients output by the correction coefficient output step.

The present invention is a program of instructions for execution by the computer to perform a processing for analyzing a network. The processing includes: a measuring system error factor recording step of recording a measuring system error factor generated independently of a frequency conversion by a device under test; a correction coefficient output step of outputting measured first coefficients and second coefficients of a correction frequency converting element wherein a signal output from one terminal is represented as a sum of a product of a signal input to the terminal and the fist coefficient and a product of a signal input to the other terminal and the second coefficient, and a ratio of the magnitudes of the second coefficients is constant; and a transmission tracking error acquiring step of acquiring a transmission tracking error generated by the frequency conversion based on the measuring system error factor recorded in the measuring system error factor recording step, and the first coefficients and the second coefficients output by the correction coefficient output step.

The present invention is a computer-readable medium having a program of instructions for execution by the computer to perform a processing for analyzing a network. The processing includes: a measuring system error factor recording step of recording a measuring system error factor generated independently of a frequency conversion by a device under test; a correction coefficient output step of outputting measured first coefficients and second coefficients of a correction frequency converting element wherein a signal output from one terminal is represented as a sum of a product of a signal input to the terminal and the first coefficient and a product of a signal input to the other terminal and the second coefficient, and a ratio of the magnitudes of the second coefficients is constant; and a transmission tracking error acquiring step of acquiring a transmission tracking error generated by the frequency conversion based on the measuring system error factor recorded in the measuring system error factor recording step, and the first coefficients and the second coefficients output by the correction coefficient output step

BRIEF DESCRIPTION OF THE DRAWINGS

FIG. 6 is a signal flow graph representing the state where the calibration tool 6 is connected to the port 4a;

FIG. 7 shows a state where the port 4b is connected to the port 4a;

FIG. 8 is a signal flow graph representing the state where the port 4b is connected to the port 4a;

BEST MODE FOR CARRYING OUT THE INVENTION

A description will now be given of an embodiment of the present invention with reference to drawings.

Figure 1:
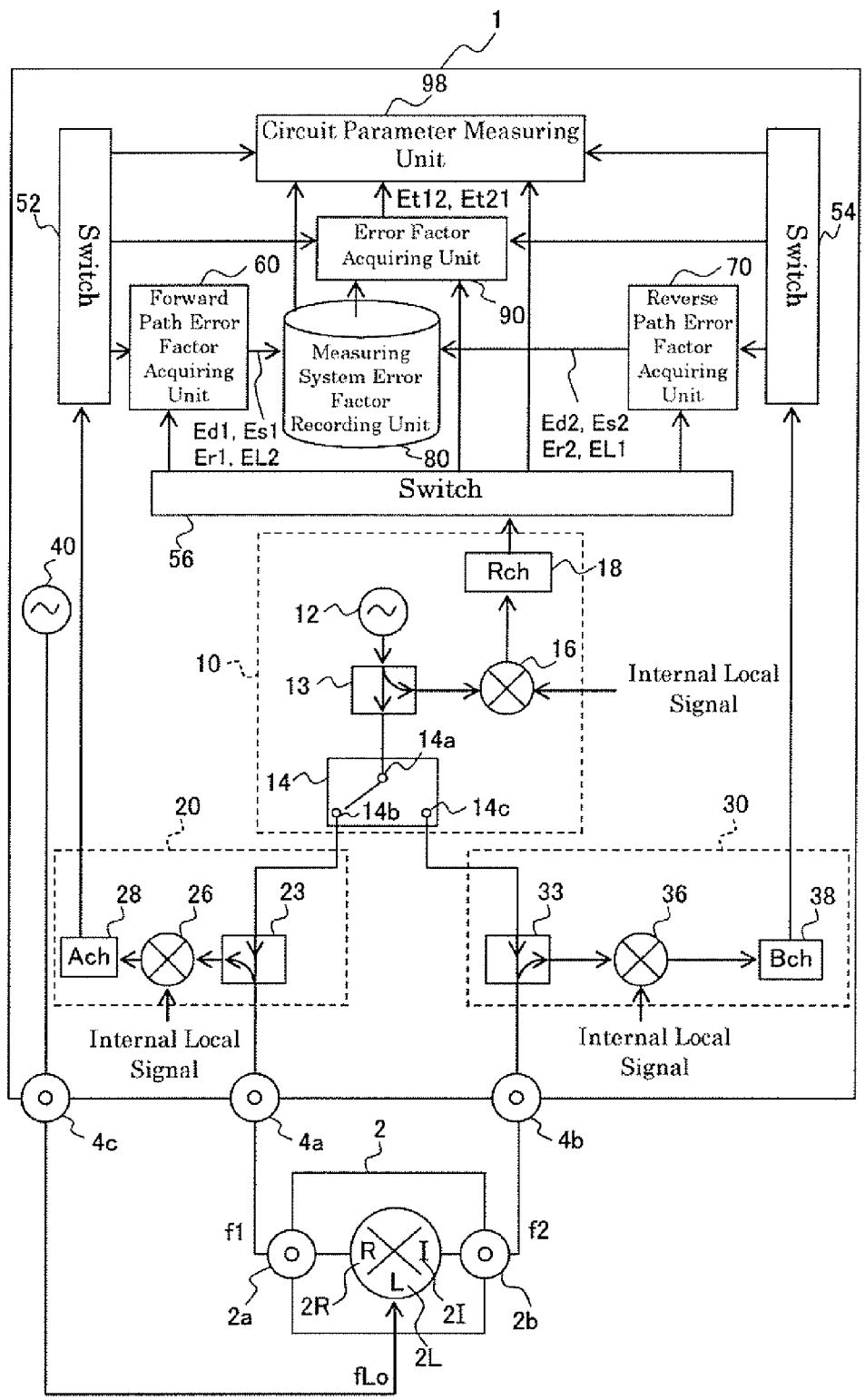
FIG. 1 is a block diagram showing a configuration of a network analyzer 1 according to an embodiment of the present invention.

FIG. 1 is a block diagram showing a configuration of a network analyzer 1 according to the embodiment of the present invention. To the network analyzer 1 is connected a DUT (Device Under Test) 2. The network analyzer 1 measures circuit parameters such as the S parameters of the DUT 2. It should be noted that if a mixer (multiplier) is used as the DUT 2, the S parameters are specifically referred to as M parameters.

Figure 2:
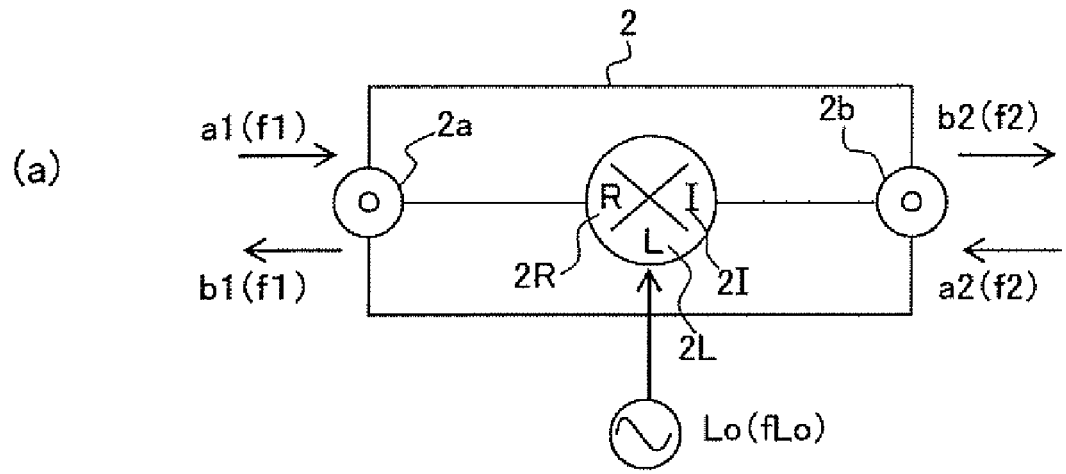
FIG. 2(a) is a view showing a configuration of the DUT 2.
FIG. 2(b) shows a relationship among signals input to/output from the first terminal 2a and the second terminal 2b.

FIG. 2(a) is a view showing a configuration of the DUT 2. The DUT 2 is a mixer (multiplier). The DUT 2 includes a first terminal 2a, a second terminal 2b, an RF signal processing unit 2R, an IF signal processing unit 21, and a local signal processing unit 2L.

If a signal a1 at a frequency f1 is input to the first terminal 2a, the signal is supplied to the RF signal processing unit 2R. Moreover, to the local signal processing unit 2L is supplied a local signal Lo (frequency fLo). The signal (frequency f1) supplied to the Rf signal processing unit 2R and the signal (frequency fLo) supplied to the local signal processing unit 2L are mixed, and a resulting signal is output from the IF signal processing unit 2I via the second terminal 2b as a signal b2 at a frequency f2 (=f1−fLo). If the signal a1 at the frequency f1 is input from the first terminal 2a, a certain portion of the signal is reflected without the frequency conversion by the DUT 2, and is output from the first terminal 2a as a signal b1 at the same frequency f1.

If a signal a2 at a frequency f2 is input to the second terminal 2b, the signal is supplied to the IF signal processing unit 2I. Moreover, to the local signal processing unit 2L is supplied the local signal Lo (frequency fLo). The signal (frequency f1) supplied to the RF signal processing unit 2R and the signal (frequency fLo) supplied to the local signal processing unit 2L are mixed, and a resulting signal is output from the RE signal processing unit 2R via the first terminal 2a as a signal b1 at the frequency f1 (=f2+fLo). If the signal a2 at the frequency f2 is input from the second terminal 2b, a certain portion of the signal is reflected without the frequency conversion by the DUT 2, and is output from the second terminal 2b as a signal b2 at the same frequency f2.

It should be noted that the signal a1 at the frequency f1 is denoted by a1(f1); the signal a2 at the frequency f2 is denoted by a2(f2); the signal b1 at the frequency f1 is denoted by b1(f1), and the signal b2 at the frequency f2 is denoted by b2(f2).

FIG. 2(b) shows a relationship among signals input to/output from the first terminal 2a and the second terminal 2b. Namely, there hold:

$$b1 = M11 \times a1 + M12 \times a2.$$

$$b2 = M21 \times a1 + M22 \times a2.$$

It should be noted that M11 and M22 are referred to as first coefficients, and M12 and M21 are referred to as second coefficients.

With reference to FIG. 1 again, the network analyzer 1 includes ports 4a and 4b, a DUT local signal port 4c, a signal source 10, measuring units 20 and 30, a DUT local signal oscillator 40, switches 52, 54, and 56, a forward path error factor acquiring unit 60, and a reverse path error factor acquiring unit 70, a measuring system error factor recording unit 80, an error factor acquiring unit 90, and a circuit parameter measuring unit 98.

The port 4a is connected to the measuring unit 20 and the first terminal 2a. The port 4a outputs the input signal (frequency f1) from the signal source 10 to the first terminal 2a.

The port 4b is connected to the measuring unit 30 and the second terminal 2b. The port 4b outputs the input signal (frequency f2) from the signal source 10 to the second terminal 2b.

The DUT local signal port 4c is connected to the DUT local signal oscillator 40. The DUT local signal port 4c supplies the DUT 2 with a DUT local signal from the DUT local signal oscillator 40.

The signal source 10 includes a signal output unit 12, a bridge 13, a switch 14, an internal mixer 16, and a receiver (Rch) 18 (input signal measuring means).

The signal output unit 12 outputs the input signal at the frequency f1 or f2.

The bridge 13 supplies the internal mixer 16 and the switch 14 with the signal output from the signal output unit 12. The signal supplied by the bridge 13 is a signal which has not been influenced by measuring system error factors caused by the network analyzer 1.

The switch 14 includes terminals 14a, 14b, and 14c. The terminal 14a is connected to the bridge 13, and receives the signal from the bridge 13. The terminal 14b is connected to the measuring unit 20, and the terminal 14c is connected to the measuring unit 30. The terminal 14a is connected to the terminal 14b or the terminal 14c. If the terminal 14a and the terminal 14b are connected with each other, the input signal output from the signal output unit f2 is supplied to the measuring unit 20 (the frequency of the input signal on this occasion is f1). If the terminal 14a and the terminal 14c are connected with each other, the input signal output from the signal output unit 12 is supplied to the measuring unit 30 (the frequency of the input signal on this occasion is f2).

The internal mixer 16 mixes the signal supplied from the bridge 13 with an internal local signal, and outputs the mixed signal.

The receiver (Rch) 18 (input signal measuring means) measures the S parameters of the signal output from the internal mixer 16. The receiver (Rch) 18 thus measures the S parameters relating to the input signal before there arises an influence of the measuring system error factors due to the network analyzer 1.

The measuring unit 20 includes a bridge 23, an internal mixer 26, and a receiver (Ach) 28 (device-under-test signal measuring means).

The bridge 23 outputs the signal supplied from the signal source 10 to the port 4a. Moreover, the bridge 23 receives a signal which has been reflected back by the DUT 2, and a signal which has passed the DUT 2 via the port 4a, and supplies the internal mixer 26 with the received signal. It should be noted that the signal which has been reflected by the DUT 2, and the signal which has passed the DUT 2 are referred to as device-under-test signal.

The internal mixer 26 mixes the signal supplied from the bridge 23 with an internal local signal, and outputs the mixed signal.

The receiver (Ach) 28 (device-under-test signal measuring means) measures the S parameters of the signal output from the internal mixer 26. The receiver (Ach) 28 thus measures the S parameters relating to the device-under-test signal.

The measuring unit 30 includes a bridge 33, an internal mixer 36, and a receiver (Bch) 38 (device-under-test signal measuring means).

The bridge 33 outputs the signal supplied from the signal source 10 to the port 4b. Moreover, the bridge 23 receives a signal which has been reflected back by the DUT 2, and a signal which has passed the DUT 2 via the port 4b, and supplies the internal mixer 36 with the received signals. It should be noted that the signal which has been reflected by the DUT 2, and the signal which has passed the DUT 2 are referred to as device-under-test signal.

The internal mixer 36 mixes the signal supplied from the bridge 33 with an internal local signal, and outputs the mixed signal.

The receiver (Bch) 38 (device-under-test signal measuring means) measures the S parameters of the signal output from the internal mixer 36. The receiver (Bch) 38 thus measures the S parameters relating to the device-under-test signal.

The DUT local signal oscillator 40 supplies the DUT 2 with the local signal Lo (frequency fLo).

Figure 3:
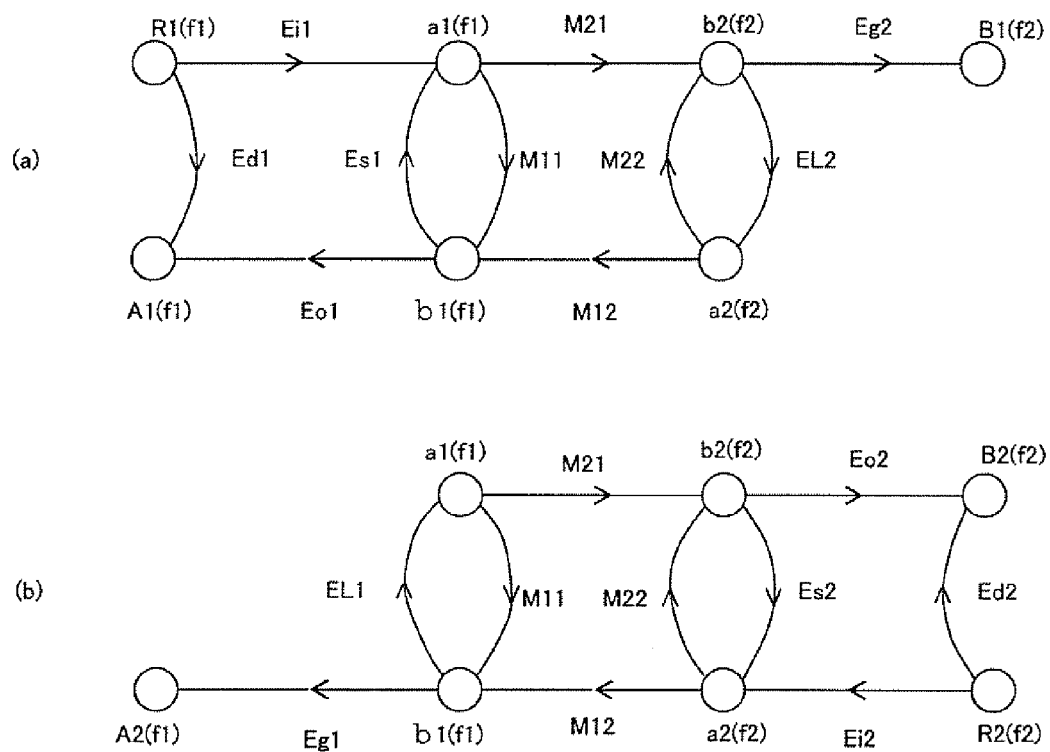
FIG. 3(a) shows a state (referred to as forward path) where the input signal frequency f1) is supplied to the DUT 2 via the measuring unit 20 (the terminal 14a and the terminal 14b are connected with each other)
FIG. 3(b) shows a state (referred to as reverse path) where the input signal (frequency f2) is supplied to the DUT 2 via the measuring unit 30 (the terminal 14a and the terminal 14c are connected with each other)

A signal flow graph representing the state shown in FIG. 1 is shown in FIG. 3. M11, M21, M12, and M22 are true M parameters (without the influence of the measuring system error factor) of the DUT 2.

FIG. 3(a) shows a state (referred to as forward path) where the input signal (frequency f1) is supplied to the DUT 2 via the measuring unit 20 (the terminal 14a and the terminal 14b are connected with each other), and FIG. 3(b) shows a state (referred to as reverse path) where the input signal (frequency f2) is supplied to the DUT 2 via the measuring unit 30 (the terminal 14a and the terminal 14c are connected with each other).

The measuring system error factors for the forward path (refer to FIG. 3(a)) include Ed1 (error caused by the direction of the bridge), Ei1, Eo1 (error caused by the frequency tracking), Es1 (error caused by the source matching), Eg2, and EL2.

The measuring system error factors for the reverse path (refer to FIG. 3(b)) include Ed2 (error caused by the direction of the bridge), Ei2, Eo2 (error caused by the frequency tracking), Es2 (error caused by the source matching), Eg1, and EL1.

The switch 52 supplies any one of the forward path error factor acquiring unit 60, the error factor acquiring unit 90, and the circuit parameter measuring unit 98 with the measured result by the receiver (Ach) 28.

The switch 54 supplies any one of the reverse path error factor acquiring unit 70, the error factor acquiring unit 90, and the circuit parameter measuring unit 98 with the measured result by the receiver (Bch) 38.

The switch 56 supplies any one of the forward path error factor acquiring unit 60, the reverse path error factor acquiring unit 70, the error factor acquiring unit 90, and the circuit parameter measuring unit 98 with the measured result by the receiver (Rch) 18, The forward path error acquiring unit 60 receives the measured result by the receiver (Ach) 28 via the switch 52. Moreover, the forward path error acquiring unit 60 receives the measured result by the receiver (Rch) 18 via the switch 56. The forward path error acquiring unit 60 acquires Ed1, Ei1·Eo1 (=Er1), Es1, and EL2 for the reverse path refer to FIG. 3(a)) based on the measured result by the receiver (Ach) 28 and the measured result by the receiver (Ach) 18.

Figure 4:
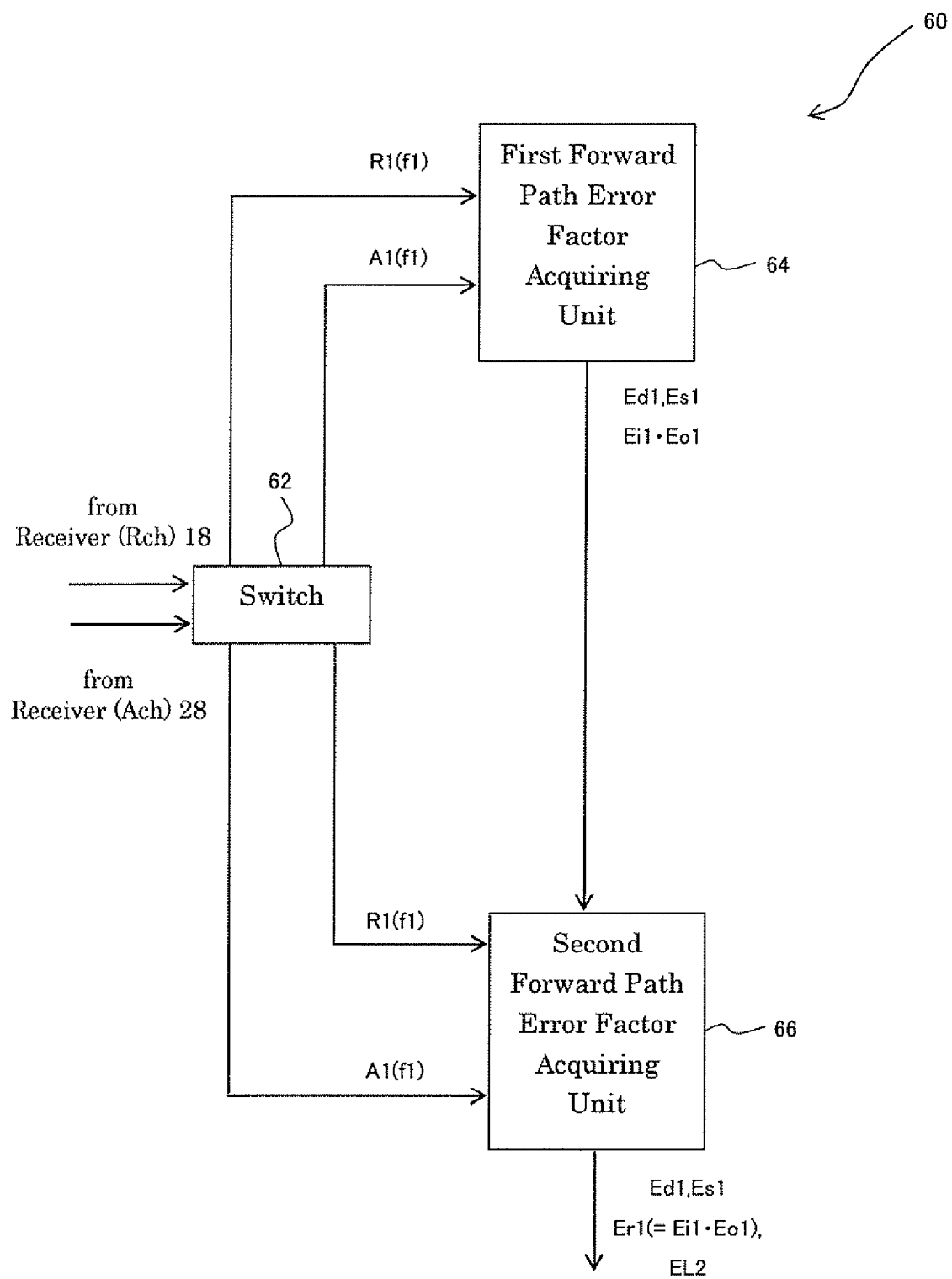
FIG. 4 is a functional block diagram showing a configuration of the forward path error factor acquiring unit 60.

FIG. 4 is a functional block diagram showing a configuration of the forward path error factor acquiring unit 60. The forward path error factor acquiring unit 60 includes a switch 62, a first forward path error factor acquiring unit 64, and a second forward path error factor acquiring unit 66.

The switch 62 transmits the measured result by the receiver (Ach) 28 and the measured result by the receiver (Rch) 18 to the first forward path error factor acquiring unit 64 or the second forward path error factor acquiring unit 66. Specifically, if a calibration tool 6 (described later) is connected to the port 4a, the switch 62 transmits the measured result by the receiver (Ach) 28 and the measured result by the receiver (Rch) 18 to the first forward path error factor acquiring unit 64. If the port 4b is connected to the port 4a, the switch 62 transmits the measured result by the receiver (Ach) 28 and the measured result by the receiver (Rch) 18 to the second forward path error factor acquiring unit 66.

Figure 5:
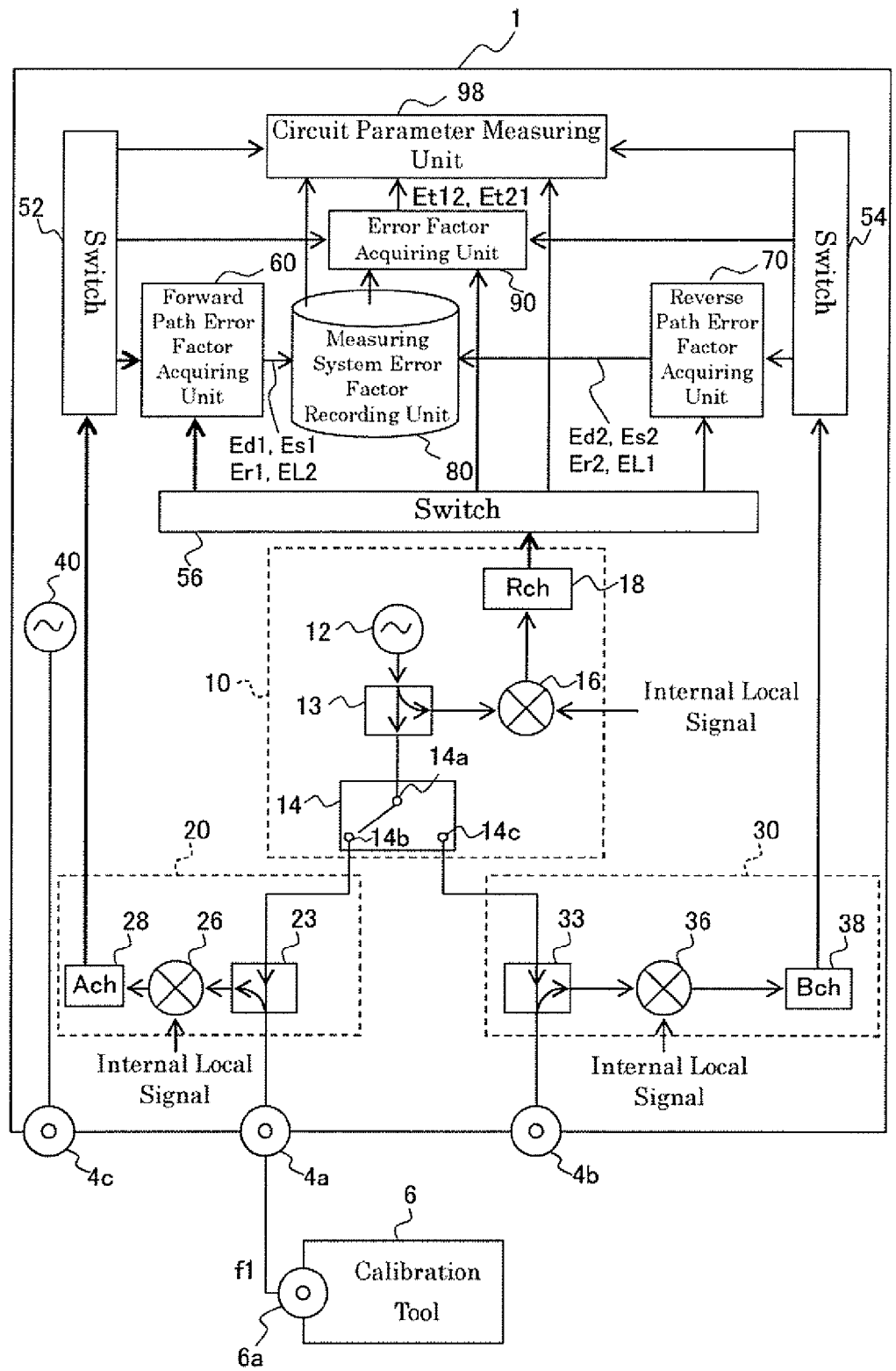
FIG. 5 shows a state where the terminal 6a of the calibration tool 6 and the port 4a are connected with each other.

The first forward path error factor acquiring unit 64 acquires Ed1, Ei1, Ei1·Eo1 (=Er1), and Es1. FIG. 5 shows a state where the terminal 6a of the calibration tool 6 and the port 4a are connected with each other. The calibration tools 6 are well-known calibration tools which realize three types of state: open circuit, short circuit, and load (standard load Z0) as described in Japanese Laid-Open Patent Publication (Kokai) No. H11-38054 (patent document 1).

Figure 6:
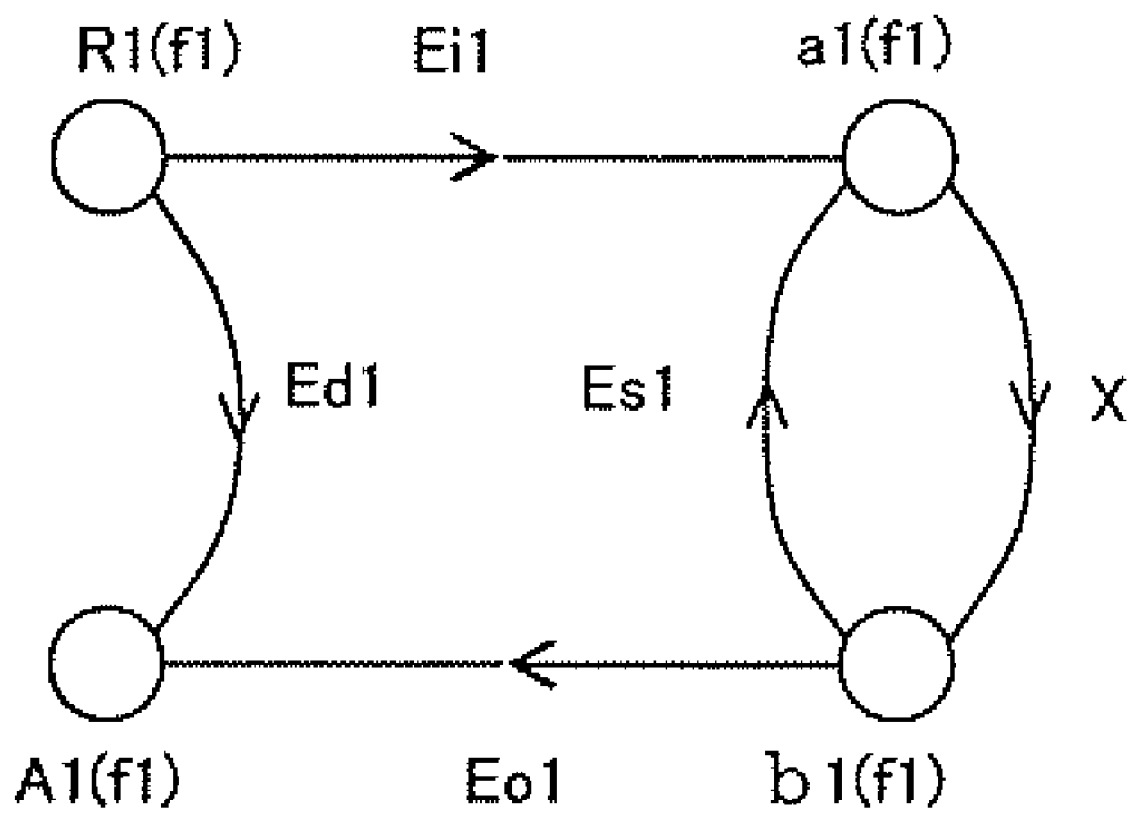

A signal flow graph representing the state where the calibration tool 6 is connected to the port 4a is shown in FIG. 6. In FIG. 6, the measured result by the receiver (Rch) 18 is R1 (f1), and the measured result by the receiver (Ach) 28 is A1 (f1). A relationship between R1(f1) and A1(f1) is represented by the following equation.

$$\frac{A1(f1)}{R1(f1)} = Ed1 + \frac{Er1 \cdot X}{1 - Es1 \cdot X} \qquad \text{[EQU. 1]}$$

On this occasion, since three types of the calibration tool 6 are to be connected, there are acquired three types of the combination of R1(f1) and A1(f1). As a result, obtained variables are three types of variable: Ed1, Ei1·Eo1 (=Er1), and Es1.

The second forward path error factor acquiring unit 66 receives Ed1, Ei1·Eo1 (=Er1), and Es1 from the fist forward path error factor acquiring unit 64, and receives the measured result by the receiver (Ach) 28 and the measured result by the receiver (Rch) 18 via the switch 62. The second forward path error factor acquiring unit 66 then acquires EL2.

Figure 7:
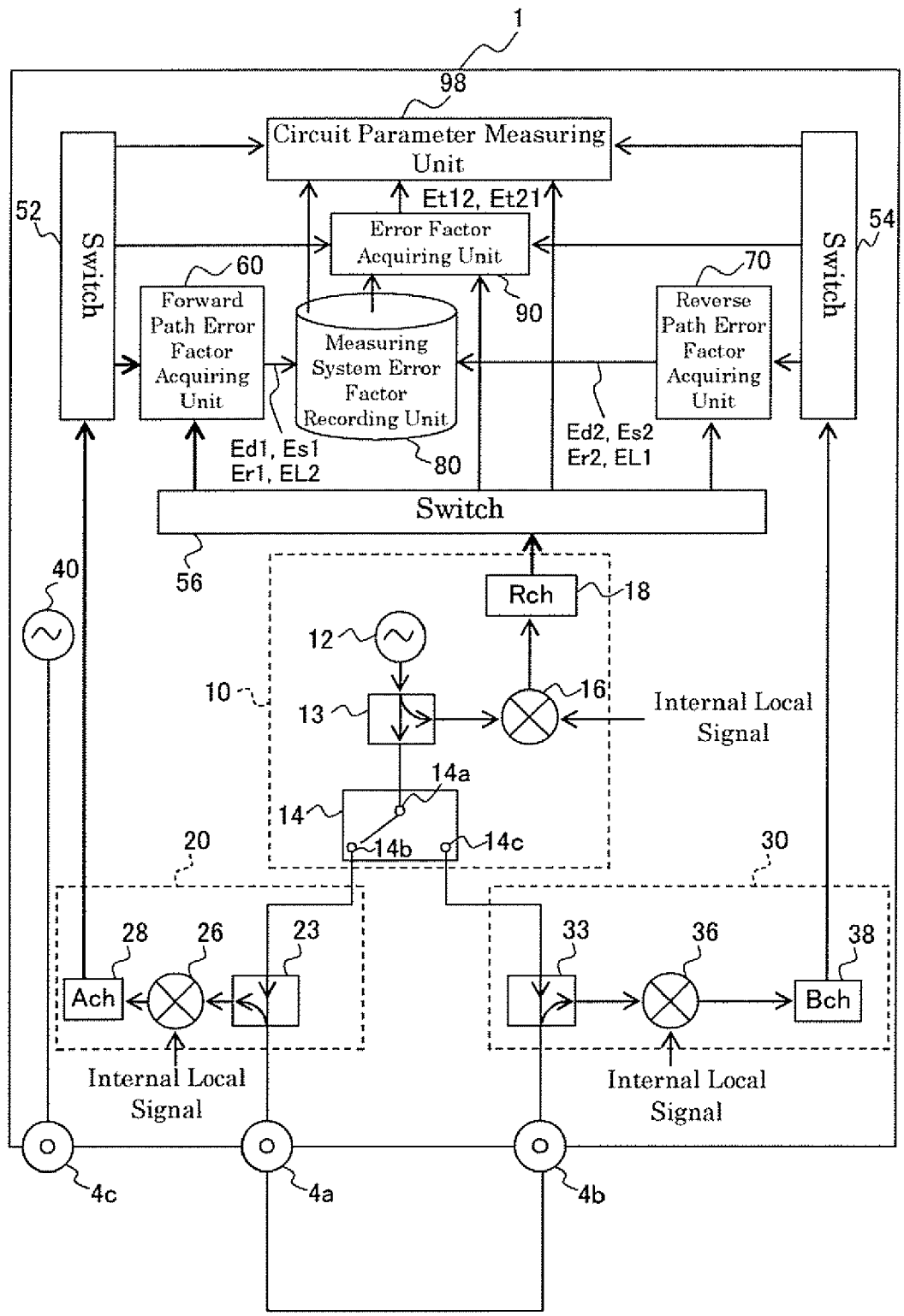
Figure 8:
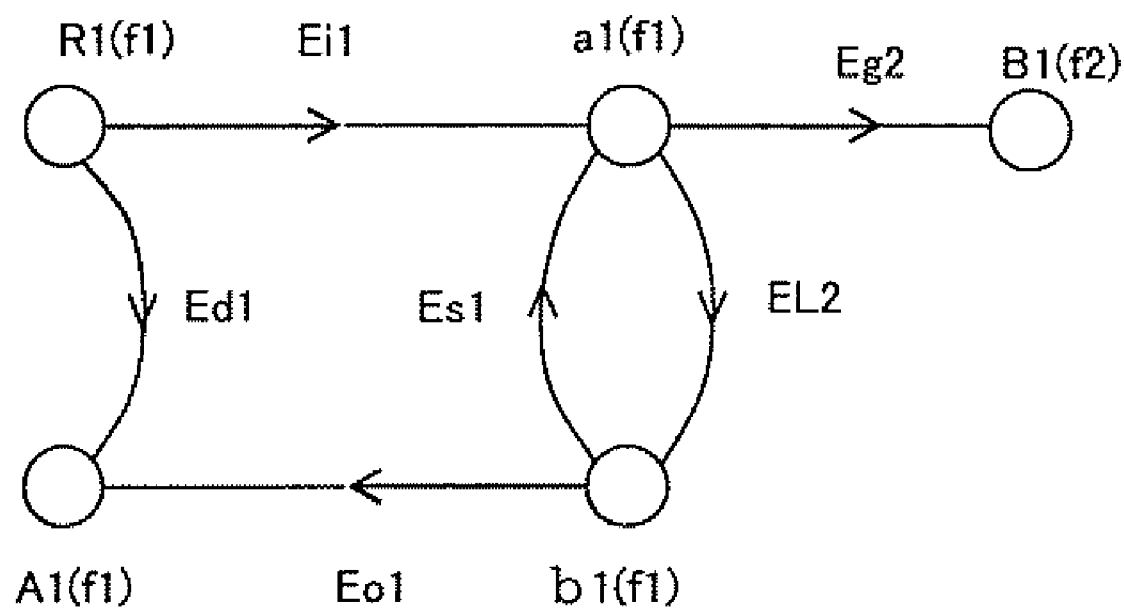

FIG. 7 shows a state where the port 4b is connected to the port 4a. A signal flow graph representing the state where the port 4b is connected to the port 4a is shown in FIG. 8. In FIG. 7, the measured result by the receiver (Rch) 18 is R1 (f1), and the measured result by the receiver (Ach) 28 is A1 (f1). It is assumed that the input signal (frequency f1) is output from the port 4a via the measuring unit 20. A relationship between R1(f1) and A1(f1) is represented by the following equation.

$$\frac{A1(f1)}{R1(f1)} = Ed1 + \frac{Er1 \cdot EL2}{1 - Es1 \cdot EL2} \qquad [\text{EQU. 2}]$$

On this occasion, Ed1, Er1, and Es1 are known, and EL2 can thus be acquired. The second forward path error factor acquiring unit 66 outputs Ed1 Ei1·Eo1 (=Er1), Es1, and EL2 to the measuring system error factor recording unit 80.

The reverse path error factor acquiring unit 70 receives the measured result by the receiver (Bch) 38 via the switch 54. Moreover, the reverse path error factor acquiring unit 70 receives the measured result by the receiver (Rch) 18 via the switch 56. The reverse path error factor acquiring unit 70 acquires Ed2, Ei2·Eo2 (=Er2), Es2, and EL1 for the reverse path (refer to FIG. 3(b)) based on the measured result by the receiver (Bch) 38 and the measured result by the receiver (Rch) 18.

Figure 9:
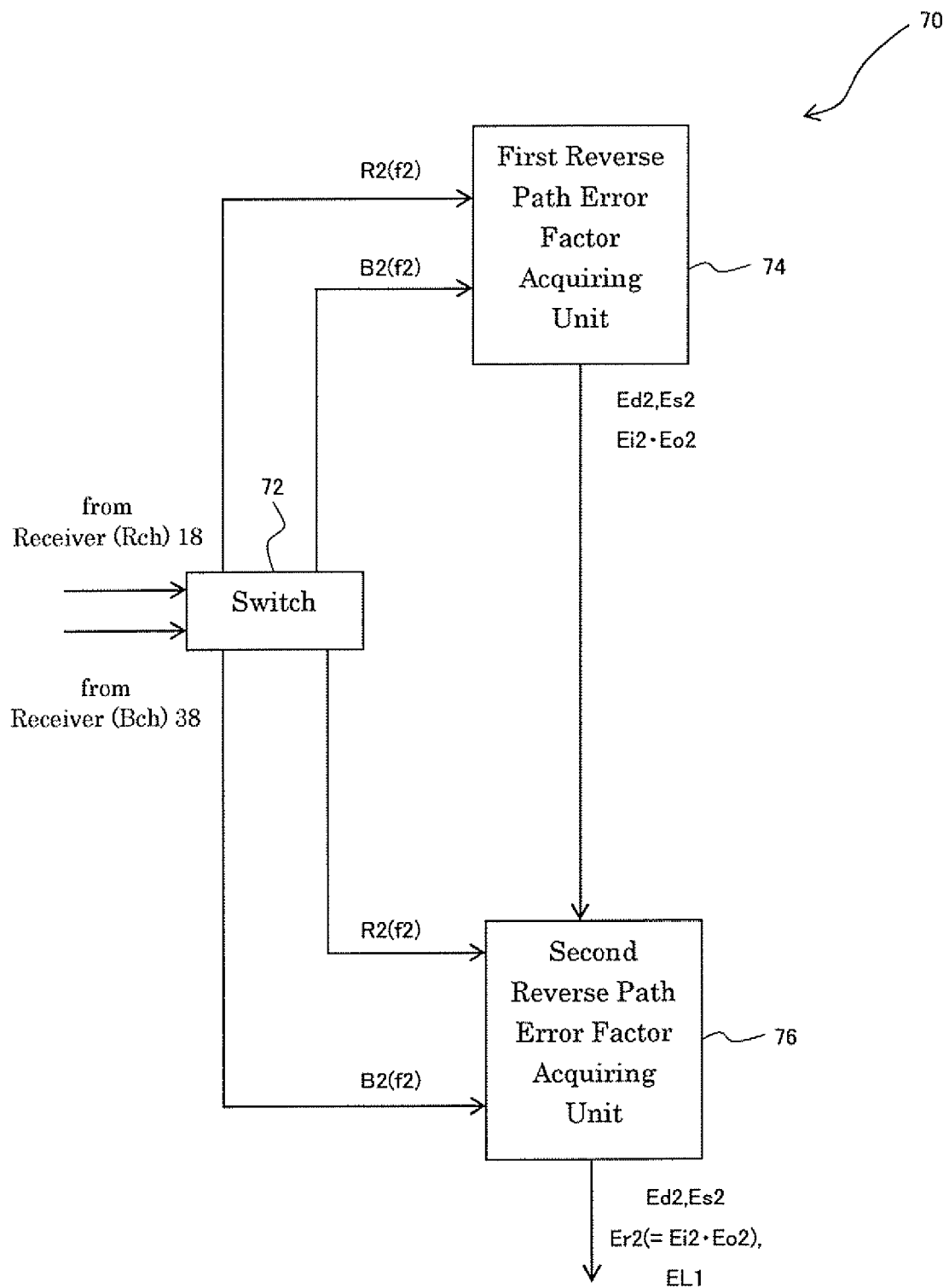
FIG. 9 is a functional block diagram showing a configuration of the reverse path error factor acquiring unit 70.

FIG. 9 is a functional block diagram showing a configuration of the reverse path error factor acquiring unit 70. The reverse path error factor acquiring unit 70 includes a switch 72, a first reverse path error factor acquiring unit 74, and a second reverse path error factor acquiring unit 76.

The switch 72 transmits the measured result by the receiver (Bch) 38 and the measured result by the receiver (Rch) 18 to the first reverse path error factor acquiring unit 74 or the second reverse path error factor acquiring unit 76. Specifically, if the calibration tool 6 is connected to the port 4b, the switch 72 transmits the measured result by the receiver (Bch) 38 and the measured result by the receiver Rch) 18 to the first reverse path error factor acquiring unit 74. If the port 4b is connected to the port 4a, the switch 72 transmits the measured result by the receiver (Bch) 38 and the measured result by the receiver (Rch) 18 to the second reverse path error factor acquiring unit 76.

The first reverse path error factor acquiring unit 74 acquires Ed2, Ei2, and Ei2·Eo2 (=Er2), and Es2. The calibration tool 6 is described before, and a detailed description thereof, therefore, is omitted. On this occasion, if the measured result by the receiver (Rch) 18 is R2(f2), and the measured result by the receiver (Bch) 38 is B2(f2), a relationship between R2(f2) and B2(f2) is represented by the following equation.

$$\frac{B2(f2)}{R2(f2)} = Ed2 + \frac{Er2 \cdot X}{1 - Es2 \cdot X} \qquad [\text{EQU. 3}]$$

On this occasion, since three types of the calibration tool 6 are to be connected, there are acquired three types of the combination of R2(f2) and B2(f2). As a result, the acquired variables are three types of variable; Ed2, Ei2·Eo2 (=Er2), and Es2

The second reverse path error factor acquiring unit 76 receives Ed2, Ei2·Eo2 (=Er2), and Es2 from the first reverse path error factor acquiring unit 74, and receives the measured result of the receiver (Bch) 38 and the measured result of the receiver (Rch) 18 via the switch 72. The second reverse path error factor acquiring unit 76 then acquires EL1.

On this occasion, if the measured result by the receiver (Rch) 18 is R2(f2), and the measured result by the receiver (Bch) 38 is B2(f2), a relationship between R2(f2) and B2(f2) is represented by the following equation. It is assumed that the input signal (frequency f2) is output from the port 4b via the measuring unit 30.

$$\frac{B2(f2)}{R2(f2)} = Ed2 + \frac{Er2 \cdot EL1}{1 - Es2 \cdot EL1} \qquad [\text{EQU. 4}]$$

On this occasion, Ed2, Er2, and Es2 are known, and EL1 can thus be acquired. The second reverse path error factor acquiring unit 76 outputs Ed2, Ei2·Eo2 (=Er2), Es2, and EL1 to the measuring system error factor recording unit 80.

The measuring system error factor recording unit 80 receives and records Ed1, Ei1·Eo1 (=Er1), Es1, and EL2 from the forward path error factor acquiring unit 60, and Ed2, Ei2·Eo2 (=Er2), Es2, and EL1 from the reverse path error factor acquiring unit 70. Ed1, Er1, Es1, EL2, Ed2, Er2, Es2, and EL1 are the measuring system error factors generated independently of the frequency conversion by the device under test.

The error factor acquiring unit 90 acquires the transmission tracking errors generated by the frequency conversion. It should be noted that the transmission tracking errors Et21 and Et12 are respectively defined as Et21=Ei1·Eg2 and Et12=Ei2·Eg1. The transmission tracking error is a measuring system error factor generated by the frequency conversion by the device under test.

Figure 11:
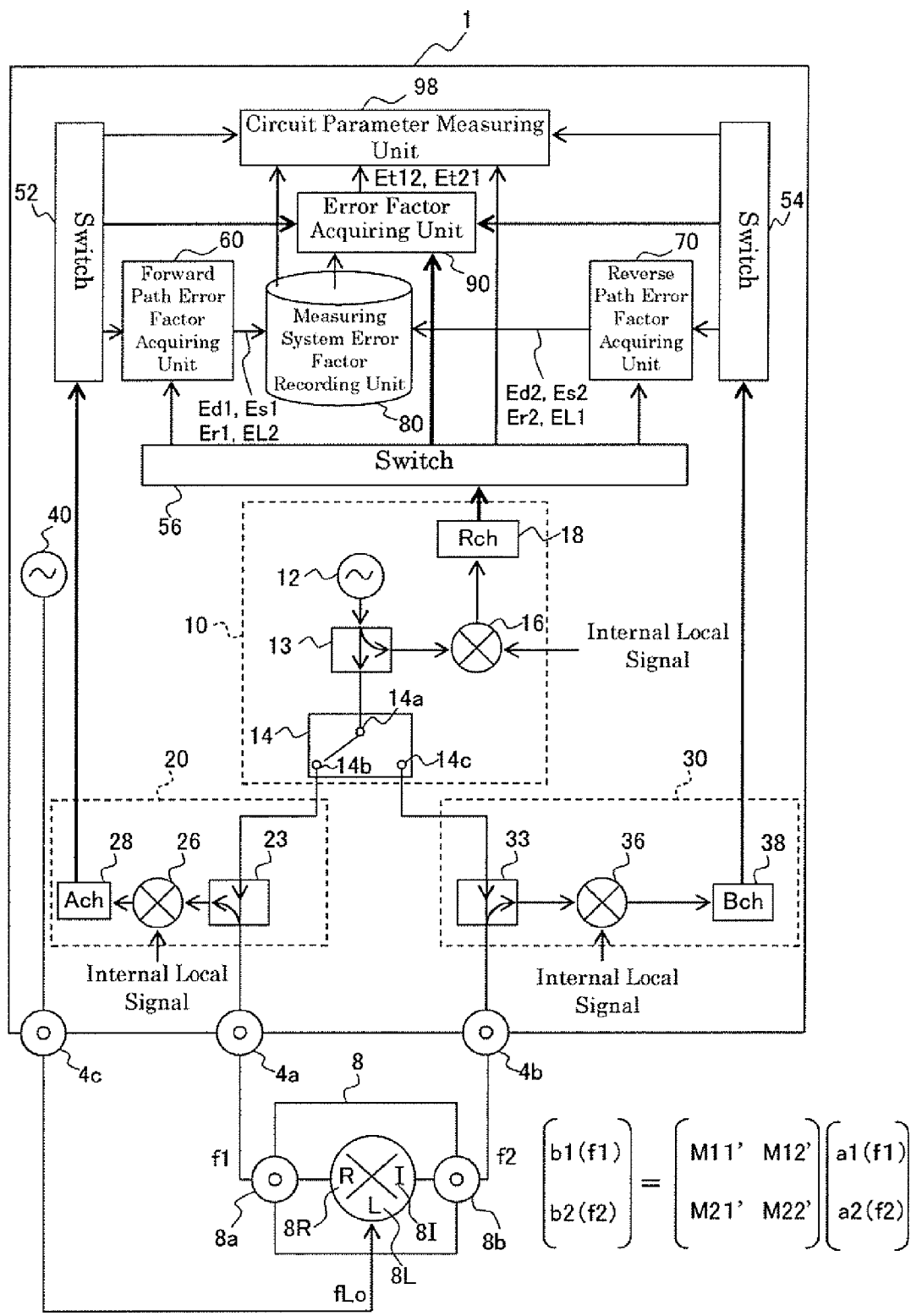
FIG. 11 is a diagram showing a calibration mixer 8 where the calibration mixer 8 is connected to the network analyzer 1.

Moreover, on acquiring the transmission tracking errors, a calibration mixer 8 is connected to the network analyzer 1 as shown in FIG. 11. The calibration mixer 8 is approximately the same as the DUT 2. However, it should be noted that if the first coefficients are M11' and M22', and the second coefficients are M12' and M21', the ratio |M12'| to |M21'| is constant, and if a bidirectional mixer is used as the calibration mixer 8, |M12'|=|M21'|.

To this calibration mixer 8 is supplied the input signal (frequency f1) via the measuring unit 20, and is then supplied the input signal (frequency f2) via the measuring unit 30, and the transmission tracking errors are acquired based on the measured result by the receiver (Rch) 18, the measured result by the receiver (Ach) 28, and the measured result by the receiver (Bch) 38.

Figure 10:
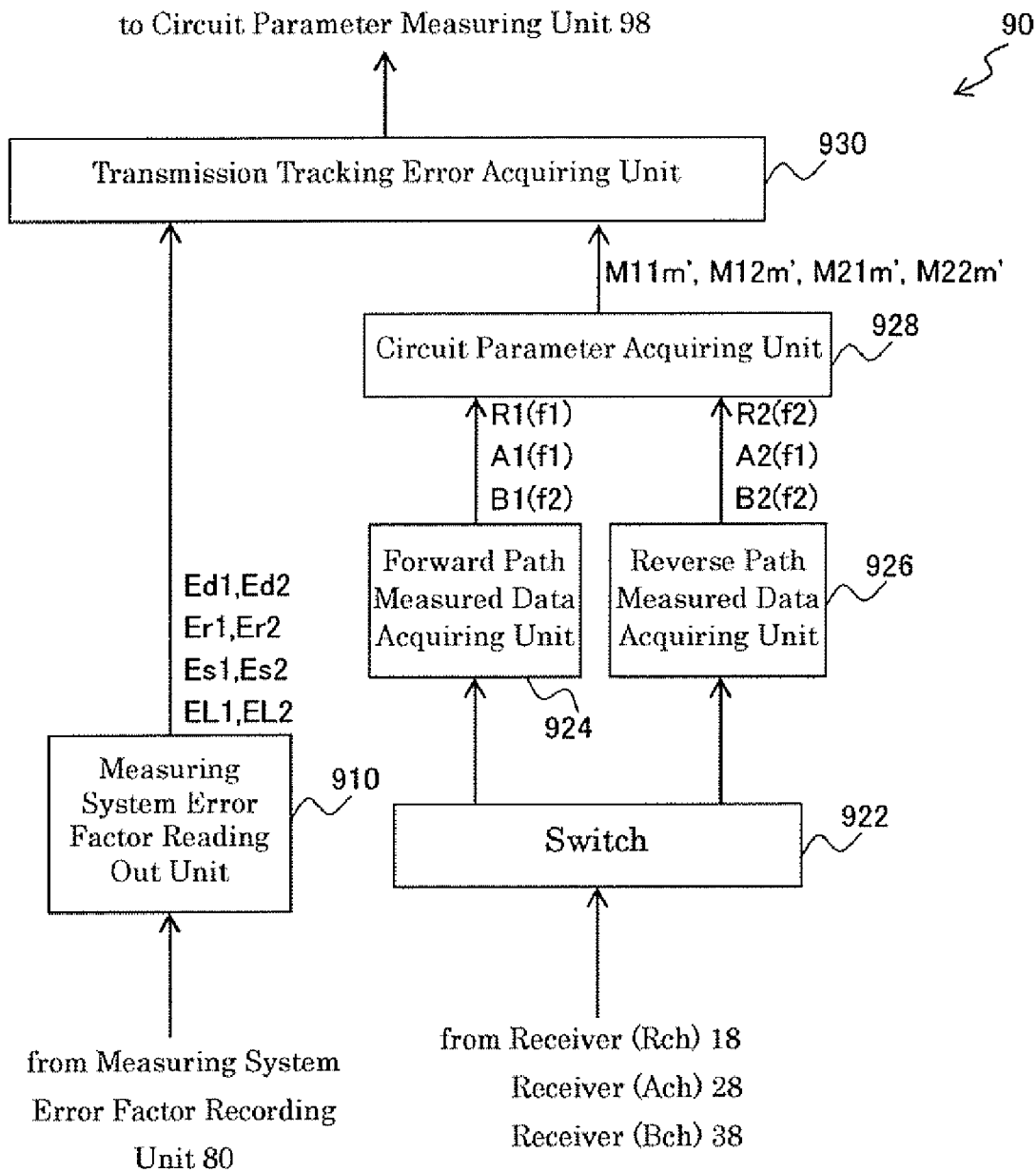
FIG. 10 is a functional block diagram showing a configuration of the error factor acquiring unit 90.

FIG. 10 is a functional block diagram showing a configuration of the error factor acquiring unit 90 The error factor acquiring unit 90 includes a measuring system error factor reading out unit 910, a switch 922, a forward path measured data acquiring unit 924, a reverse path measured data acquiring unit 926, a circuit parameter acquiring unit (calibration coefficient output means) 928, and a transmission tracking error acquiring unit 930.

The measuring system error factor reading out unit 910 reads out Ed1, Er1, Es1, EL2, Ed2, Er2, Es2, and EL1 from the measuring system error factor recording unit 80, and outputs them to the transmission tracking error acquiring unit 930.

The switch 922 transmits the measured result by the receiver (Rch) 18, the measured result by the receiver (Ach) 28, and the measured result by the receiver (Bch) 38 to the forward path measured data acquiring unit 924 or the reverse path measured data acquiring unit 926. Specifically, if the input signal (frequency f1) is supplied via the measuring unit 20 (the terminal 14a and the terminal 14b are connected with each other), the measured result is transmitted to the forward path measured data acquiring unit 924. If the input signal (frequency f2) is supplied via the measuring unit 30 (the terminal 14a and the terminal 14c are connected with each other), the measured result is transmitted to the reverse path measured data acquiring unit 926.

The forward path measured data acquiring unit 924 outputs the measured result by the receiver (Rch) 18, the measured result by the receiver (Ach) 28, and the measured result by the receiver (Bch) 38 received from the switch 922 respectively as R1(f1), A1(f1), and B1(f2) to the circuit parameter acquiring unit 928.

The reverse path measured data acquiring unit 926 outputs the measured result by the receiver (Rch) 18, the measured result by the receiver (Ach) 28, and the measured result by the receiver (Bch) 38 received from the switch 922 respectively as R2(f2), A2(f1), and B2(f2) to the circuit parameter acquiring unit 928.

The circuit parameter acquiring unit (calibration coefficient output means) 928 acquires the M parameters of the calibration mixer 8 based on the R1(f1), A1(f1), and B1(f2) received from the forward path measured data acquiring unit 924, and R2(f2), A2(f1), and B2(f2) received from the reverse path measured data acquiring unit 926.

If the M parameters acquired by the circuit parameter acquiring unit 928 are denoted by M11$m'$, M12$m'$, M21$m'$, and M22$m'$, $M11m' = A1(f1)/R1(f1)$, $M12m' = A2(f1)/R2(f2)$, $M21m' = B1(f2)/R1(f1)$, and $M22m' = B2(f2)/R2(f2)$.

The transmission tracking error acquiring unit 930 receives the M parameters: M11$m'$, M12$m'$, M21$m'$, and M22$m'$, of the calibration mixer 8 acquired by the circuit parameter acquiring unit 928, and Ed1, Er1, Es1, EL2, Ed2, Er2, Es2, and EL1 read out by the measuring system error factor reading out unit 910, thereby acquiring the transmission tracking errors Et21 and Et12.

First, detailed analysis of the network analyzer 1 reveals that there exists a relationship represented by the following equation (1). The proof thereof will be given later. Moreover, the capital L included in "EL1" and "EL2" is denoted by "l".

[EQU. 5]

$$Eg_1 = \left(1 - Ed_1 \frac{Es_1 - El_1}{Er_1}\right) Eo_1 \quad \text{(equation 1)}$$

$$Eg_2 = \left(1 - Ed_2 \frac{Es_2 - El_2}{Er_2}\right) Eo_2$$

If there is designated as: X=Eo2/Eo1, the transmission tracking errors Et21 and Et12 are represented by the following equation 2. Moreover, the capital L included in "EL1" and "EL2" is denoted by "l".

[EQU. 6]

$$Et_{21} = Er_1 X \left(1 - Ed_2 \frac{Es_2 - El_2}{Er_2}\right) \quad \text{(equation 2)}$$

$$Et_{12} = Er_2 \frac{1}{X} \left(1 - Ed_1 \frac{Es_1 - El_1}{Er_1}\right)$$

Eo1 is an error factor generated in a passage from the device-under-test signal being output from the first terminal 2a of the DUT 2 without the frequency conversion to the device-under-test signal being received by the receiver (Ach) 28. Eo2 is an error factor generated in a passage from the device-under-test signal being output from the second terminal 2b of the DUT 2 without the frequency conversion to the device-under-test signal being received by the receiver (Bch) 38.

As Ed1, Er1, Es1, EL1, Ed2, Er2, Es2, and EL2, those read out by the measuring system error factor reading out unit 910 can be used. Thus, if X is known, it is possible to acquire transmission tracking errors Et21 and Et12.

On this occasion, there holds a relationship as expressed by the following equation 3 between the M parameters: M11', M12', M21', and M22' of the calibration mixer 8 and the measured results of the M parameters: M11$m'$, M12$m'$, M21$m'$, and M22$m'$ acquired by the circuit parameter acquiring unit 928. It should be noted that (prime) such as one used in "M11'" is omitted, and "M11'" is thus denoted by "M11", for example. Moreover, the capital L included in "EL1" and "EL2" is denoted by "l".

[EQU. 7]

$$\begin{pmatrix} M_{11} & M_{12} \\ M_{21} & M_{22} \end{pmatrix} = \begin{pmatrix} \frac{M_{11m} - Ed_1}{Er_1} & \frac{M_{12m}}{Et_{12}} \\ \frac{M_{21m}}{Et_{21}} & \frac{M_{22m} - Ed_2}{Er_2} \end{pmatrix} \quad \text{(equation 3)}$$

$$\begin{pmatrix} 1 + Es_1 \frac{M_{11m} - Ed_1}{Er_1} & El_1 \frac{M_{12m}}{Et_{12}} \\ El_2 \frac{M_{21m}}{Et_{21}} & 1 + Es_2 \frac{M_{22m} - Ed_2}{Er_2} \end{pmatrix}^{-1}$$

By applying the equation 2 to the equation 3, M21'/M12' is acquired as expressed by the following equation 4. It should be noted that "'" (prime) such as one used in "M11'" is omitted, and "M11'" is thus denoted by "M11", for example. Moreover, the capital L included in "EL1" and "EL2" is denoted by "l".

[EQU. 8]

$$\frac{M_{21}}{M_{12}} = \frac{1}{X^2} \cdot \frac{M_{21m}\left(1 - Ed_1 \frac{Es_1 - El_1}{Er_1}\right)}{M_{12m}\left(1 - Ed_2 \frac{Es_2 - El_2}{Er_2}\right)} \quad \text{(equation 4)}$$

On this occasion, |M12'|=|M21'|, and there thus holds M12'=M21'Xe$^\theta$. It should be noted that θ is a constant determined by the phase of the local signal Lo. The equation 4 is solved for X, and the following equation 5 is consequently acquired. It should be noted that "'" (prime) such as one used in "M11" is omitted, and "M11" is thus denoted by "M11", for example. Moreover, the capital L included in "EL1" and "EL2" is denoted by "l".

[EQU. 9]

$$X = e^{\frac{\theta}{2}} \sqrt{\frac{M_{21m}\left(1 - Ed_1 \frac{Es_1 - El_1}{Er_1}\right)}{M_{12m}\left(1 - Ed_2 \frac{Es_2 - El_2}{Er_2}\right)} \cdot \frac{[Er_2 + (M_{22m} - Ed_2)(Es_2 - El_2)]}{[Er_1 + (M_{11m} - Ed_1)(Es_1 - El_1)]}} \quad \text{(equation 5)}$$

It should be noted that it is possible to acquire θ in the equation 5 while an arbitrary time point in a period during which the forward path error factor acquiring unit 60 or the reverse path error factor acquiring unit 70 is acquiring the measuring system error factors is designated as a reference, and θ at this reference time point is designated as 0.

Consequently, X is acquired based on Ed1, Er1, Es1, EL1, Ed2, Er2, Es2, and EL2 recorded in the measuring system error factor recording unit 80, and the M parameters: M11*m*', M12*m*', M21*m*', and M22*m*' of the calibration mixer 8 acquired by the circuit parameter acquiring unit (calibration coefficient output means) 928 (equation 5), and the transmission tracking errors Et21 and Et12 are acquired based on X (equation 2).

The circuit parameter measuring unit 98 acquires the true M parameters of the DUT 2. The true M parameters imply M parameters from which the influence of the error factors is eliminated.

Moreover, when the true M parameters of the DUT 2 are acquired, the DUT 2 is connected to the network analyzer 1 as shown in FIG. 1. To the DUT 2 is supplied the input signal (frequency f1) via the measuring unit 20, and is then supplied the input signal (frequency f2) via the measuring unit 30, and the true M parameters of the DUT 2 are acquired based on the measured result by the receiver (Rch) 18, the measured result by the receiver (Ach) 28 and the measured result by the receiver (Bch) 38.

Figure 12:
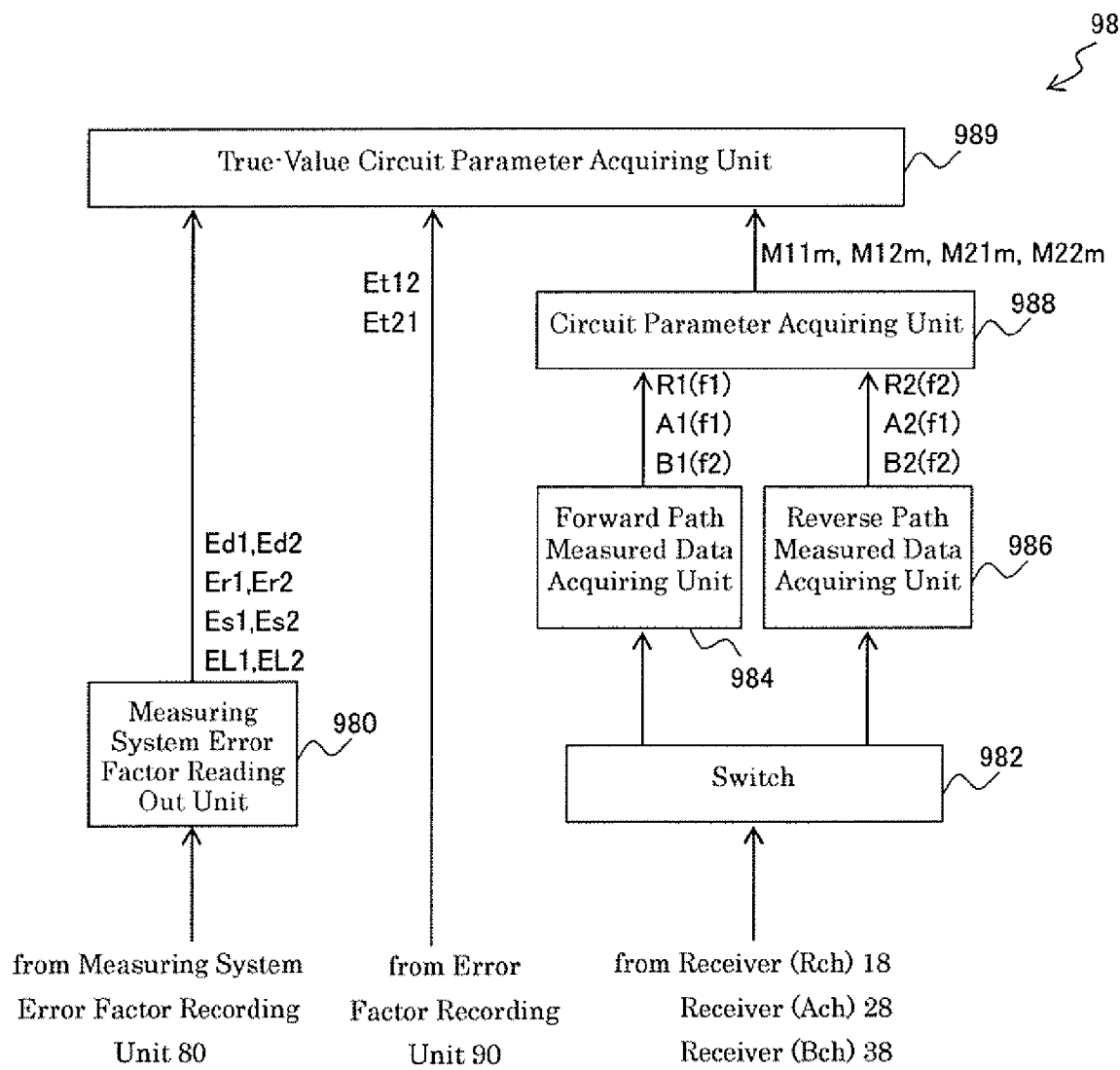
FIG. 12 is a functional block diagram showing a configuration of the circuit parameter measuring unit 98.

FIG. 12 is a functional block diagram showing a configuration of the circuit parameter measuring unit 98. The circuit parameter measuring unit 98 includes a measuring system error factor reading out unit 980, a switch 982, a forward path measured data acquiring unit 984, a reverse path measured data acquiring unit 986, a circuit parameter acquiring unit 988, and a true-value circuit parameter acquiring unit 989.

The measuring system error factor reading out unit 980 reads out Ed1, Er1, Es1, EL2, Ed2, Er2, Es2, and EL1 from the measuring system error factor recording unit 80, and outputs them to the true-value circuit parameter acquiring unit 989.

The switch 982 transmits the measured result by the receiver (Rch) 18, the measured result by the receiver (Ach) 28, and the measured result by the receiver (Bch) 38 to the forward path measured data acquiring unit 984, or the reverse path measured data acquiring unit 986. Specifically, if the input signal (frequency f1) is supplied via the measuring unit 20 (the terminal 14*a* and the terminal 14*b* are connected with each other), the measured result is transmitted to the forward path measured data acquiring unit 984. If the input signal (frequency f2) is supplied via the measuring unit 30 (the terminal 14*a* and the terminal 14*c* are connected with each other), the measured result is transmitted to the reverse path measured data acquiring unit 986.

The forward path measured data acquiring unit 984 outputs the measured result by the receiver (Rch) 18, the measured result by the receiver (Ach) 28, and the measured result by the receiver (Bch) 38 received from the switch 982 respectively as R1(f1), A1(f1), and B1(f2) to the circuit parameter acquiring unit 988.

The reverse path measured data acquiring unit 986 outputs the measured result by the receiver (Rch) 18, the measured result by the receiver (Ach) 28, and the measured result by the receiver (Bch) 38 received from the switch 982 respectively as R2(f2), A2(f1), and B2(f2) to the circuit parameter acquiring unit 988.

The circuit parameter acquiring unit 988 acquires the M parameters of the DUT 2 based on R1(f1), A1(f1), and B1(f2) received from the forward path measured data acquiring unit 984, and R2(f2), A2(f1), and B2(f2) received from the reverse path measured data acquiring unit 986.

If the M parameters acquired by the circuit parameter acquiring unit 988 are M11*m*, M12*m*, M21*m*, and M22*m*, $M11m = A1(f1)/R1(f1),$ $M12m = A2(f1)/R2(f2),$ $M21m = B1(f2)/R1(f1),$ and $M22m = B2(f2)/R2(f2).$ The true value circuit parameter acquiring unit 989 receives the M parameters: M11*m*, M12*m*, M21*m*, and M22*m* of the DUT 2 acquired by the circuit parameter acquiring unit 988, Ed1, Er1, Es1, EL2, Ed2, Er2, Es2, and EL1 read out by the measuring system error factor reading out unit 980, and the transmission tracking errors Et21 and Et12 acquired by the error factor acquiring unit 90, and then acquires the true M parameters: M11, M12, M21, and M22 of the DUT 2.

The true M parameters: M11, M12, M21, and M22 of the DUT 2 can be acquired according to the equation 3.

Figure 13:
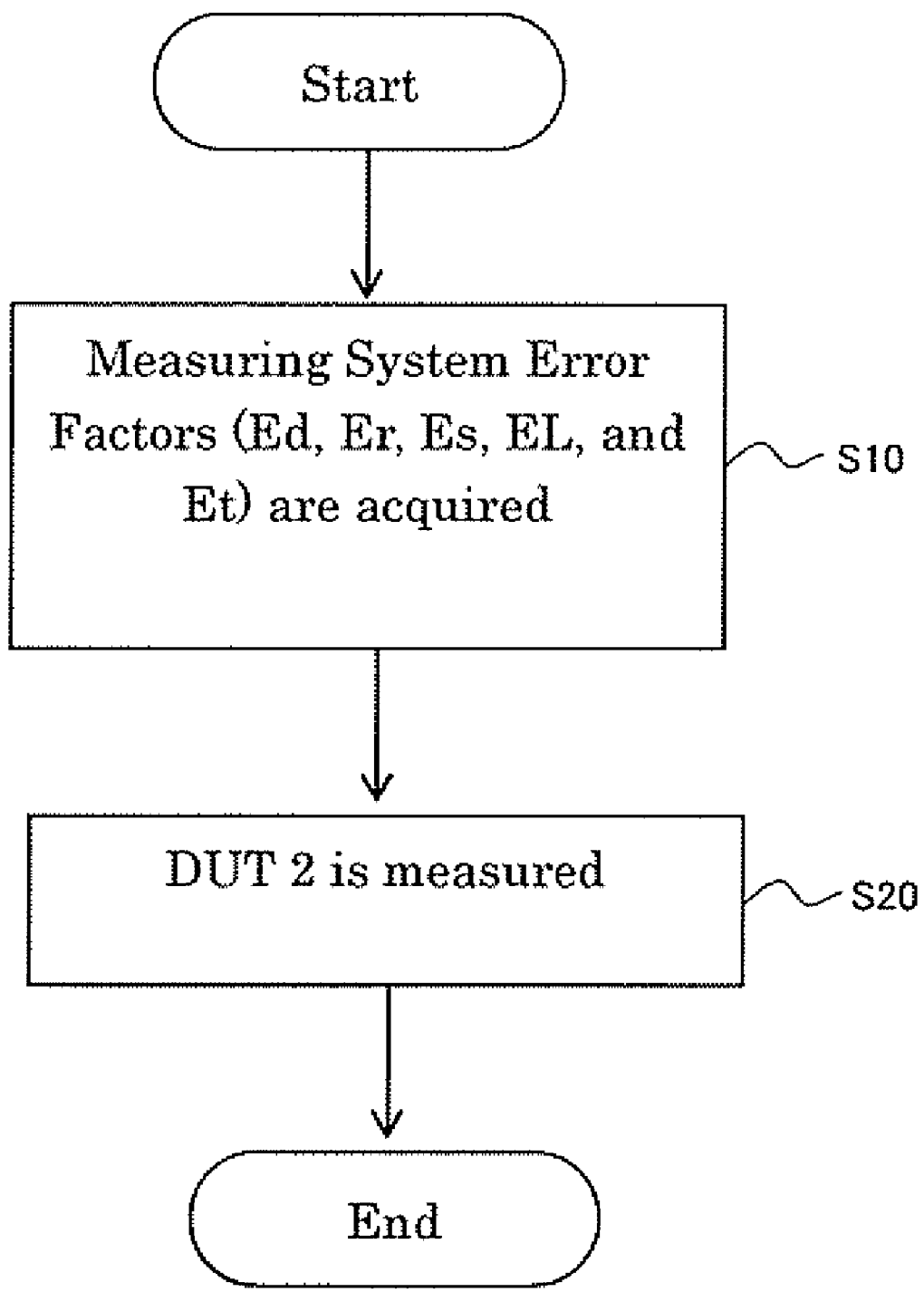
FIG. 13 is a flowchart showing the operation of the embodiment of the present invention.

A description will now be given of an operation of the embodiment of the present invention FIG. 13 is a flowchart showing the operation of the embodiment of the present invention.

First, the measuring system error factors (Ed, Er, Es, EL, and Et) of the network analyzer 1 are acquired (S10). It should be noted that Ed comprehensively represents Ed1 and Ed2; Er comprehensively represents Er1 and Er2; Es comprehensively represents Es1 and Es2; EL comprehensively represents EL1 and EL2; and Et comprehensively represents Et21 and Et12.

Figure 14:
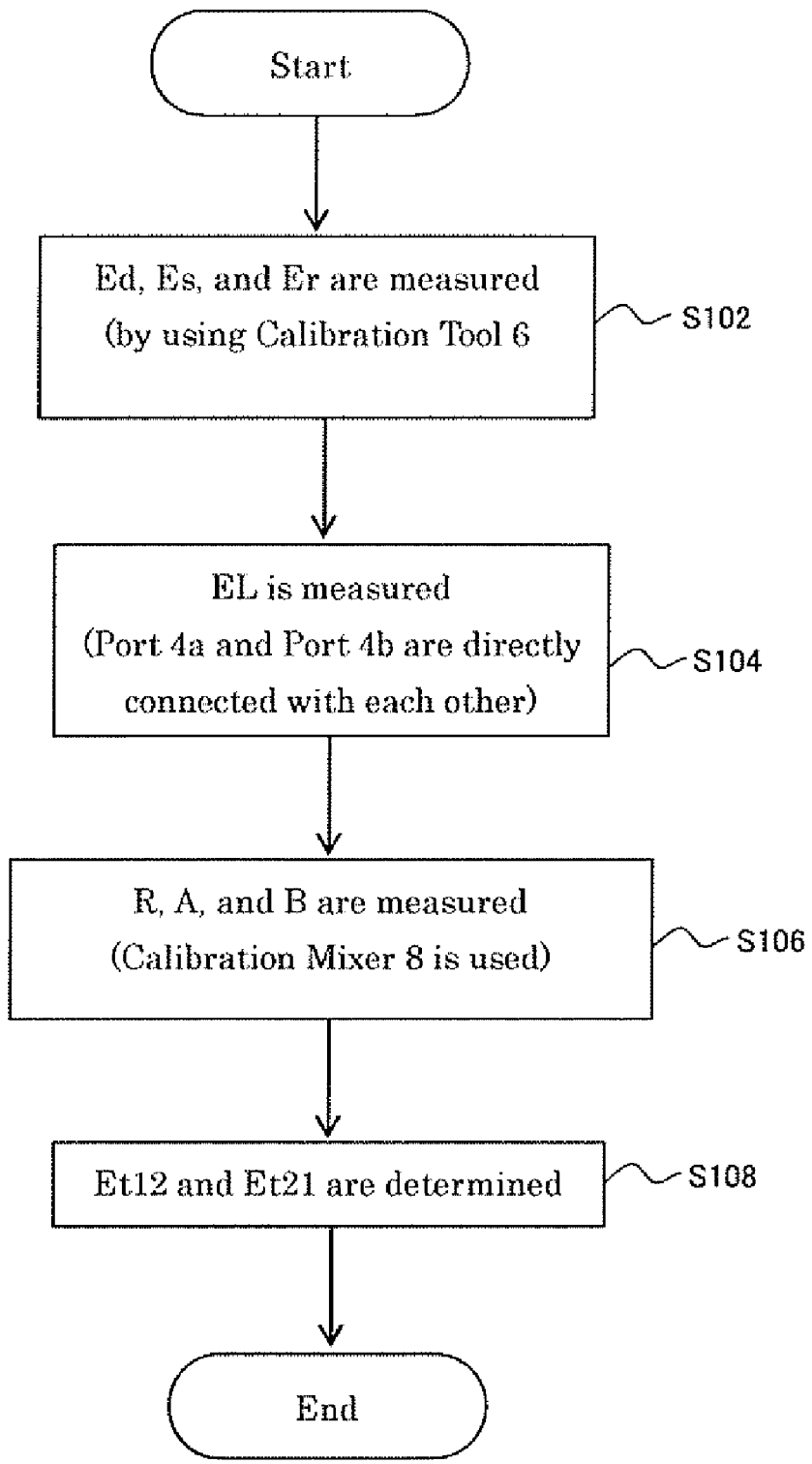
FIG. 14 is a flowchart showing a procedure to acquire the measuring system error factors (Ed, Er, Es, EL, and Et) of the network analyzer 1.

The DUT 2 is connected to the network analyzer 1, and the M parameters of the DUT 2 are measured (S20), FIG. 14 is a flowchart showing a procedure to acquire the measuring system error factors (Ed, Er, Es, EL, and Et) of the network analyzer 1.

First, the calibration tool 6 is used to measure Ed, Er, and Es (S102).

In more detail, the three types (open circuit, short circuit, and load (standard load Z0)) of the calibration tool 6 are first connected to the port 4a. On this occasion, the measured result by the receiver (Ach) 28 and the measured result by the receiver (Rch) 18 are supplied to the first forward path error factor acquiring unit 64 via the switch 62. The first forward path error factor acquiring unit 64 acquires Ed1, Er1, and Es1.

The three types (open circuit, short circuit, and load (standard load Z0)) of the calibration tool 6 are then connected to the port 4b. On this occasion, the measured result by the receiver (Bch) 38, and the measured result by the receiver (Rch) 18 are supplied to the first reverse path error factor acquiring unit 74 via the switch 72. The first reverse path error factor acquiring unit 74 acquires Ed2, Er2, and Es2.

The port 4a and the port 4b are then directly connected with each other, and EL is then measured (S104).

In more detail, the input signal (frequency f1) is output from the port 4a via the measuring unit 20. On this occasion, the measured result by the receiver (Ach) 28 and the measured result by the receiver (Rch) 18 are supplied to the second forward path error factor acquiring unit 66 via the switch 62. The second forward path error factor acquiring unit 66 acquires EL2. The second forward path error factor acquiring unit 66 outputs Ed1, Er1, Es1, and EL2 to the measuring system error factor recording unit 80.

The input signal (frequency f2) is then output from the port 4b via the measuring unit 30. On this occasion, the measured result by the receiver (Bch) 38 and the measured result by the receiver (Rch) 18 are supplied to the second reverse path error factor acquiring unit 76 via the switch 72. The second reverse path error factor acquiring unit 76 acquires EL1. The second reverse path error factor acquiring unit 76 outputs Ed2, Er2, Es2, and EL1 to the measuring system error factor recording unit 80.

The calibration mixer 8 is then connected to the network analyzer 1, and R, A, and B are measured (S106). It should be noted that R comprehensively represents R1(f1) and R2(f2); A comprehensively represents A1(f1) and A2(f1); and B comprehensively represents B1(f2) and B2(f2).

In more detail, the input signal (frequency f1) is supplied via the measuring unit 20. On this occasion, the measured result by the receiver (Rch) 18, the measured result by the receiver (Ach) 28, and the measured result by the receiver (Bch) 38 are supplied to the forward path measured data acquiring unit 924 via the switch 922. The forward path measured data acquiring unit 924 outputs R1(f1), A1(f1), and B1(f2) to the circuit parameter acquiring unit 928.

The input signal (frequency f2) is then supplied via the measuring unit 30. On this occasion, the measured result by the receiver (Rch) 18, the measured result by the receiver (Ach) 28, and the measured result by the receiver (Bch) 38 are supplied to the reverse path measured data acquiring unit 926 via the switch 922. The reverse path measured data acquiring unit 926 outputs R2(f2), A2(f1), and B2(f2) to the circuit parameter acquiring unit 928.

The circuit parameter acquiring unit 928 acquires the M parameters: M11$m'$, M12$m'$, M21$m'$, and M22$m'$ of the calibration mixer 8.

The transmission tracking error acquiring unit 930 finally receives the M parameters: M11$m'$, M12$m'$, M21$m'$, and M22$m'$, of the calibration mixer 8 acquired by the circuit parameter acquiring unit 928, and Ed1, Er1, Es1, EL2, Ed2, Er2, Es2, and EL1 read out by the measuring system error factor reading out unit 910, thereby acquiring transmission tracking errors Et21 and Et12 (S108).

Specifically, the transmission tracking errors Et21 and Et12 are acquired by acquiring X according to the equation 5, and assigning X to the equation 2.

Figure 15:
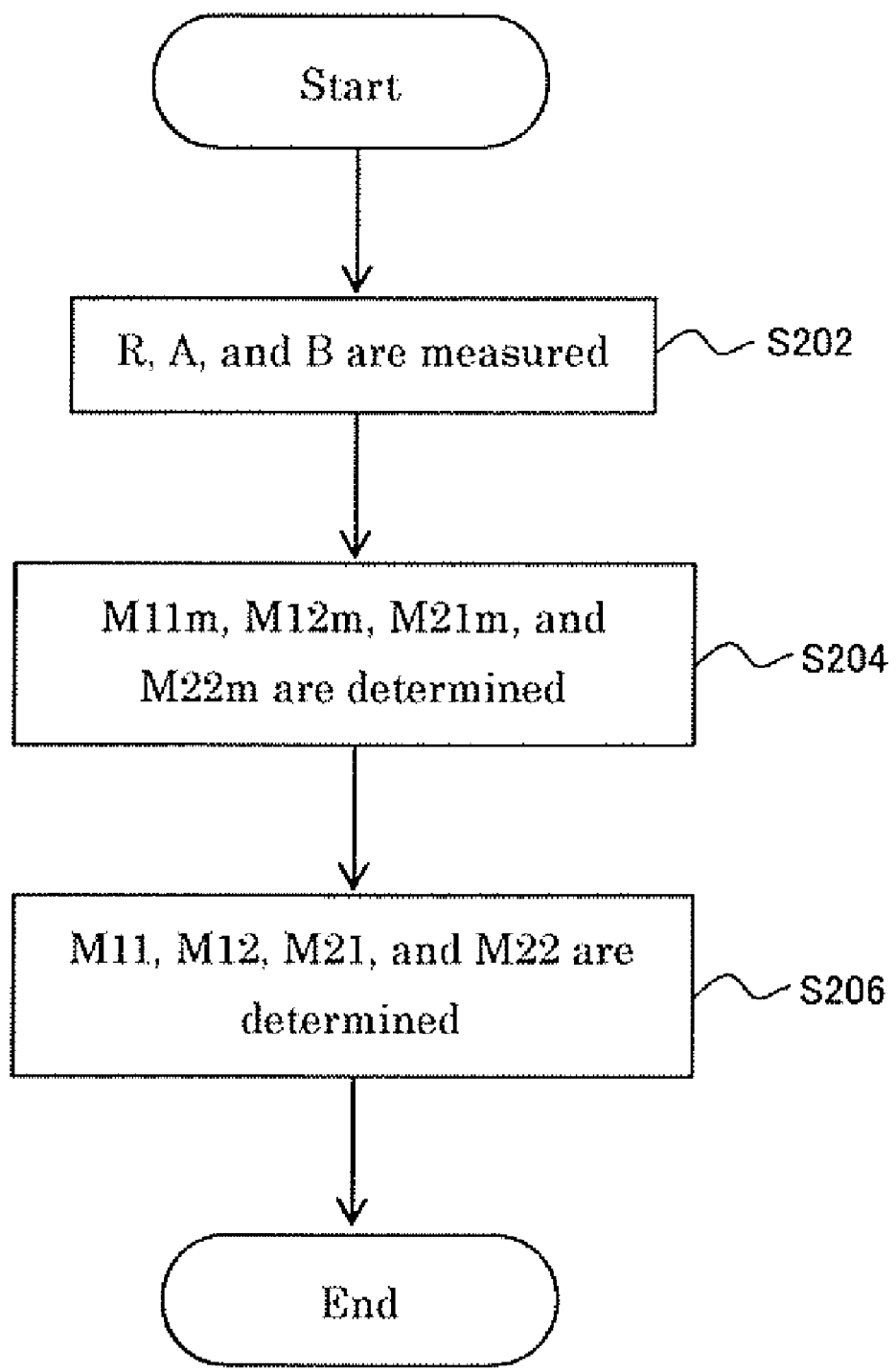
FIG. 15 is a flowchart showing a procedure to acquire the M parameters of the DUT 2.

FIG. 15 is a flowchart showing a procedure to acquire the M parameters of the DUT 2.

The DUT 2 is first connected to the network analyzer 1 and R, A, and B are measured (S202).

In more detail, the input signal (frequency f1) is supplied via the measuring unit 20. On this occasion, the measured result by the receiver (Rch) 18, the measured result by the receiver (Ach) 28, and the measured result by the receiver (Bch) 38 are supplied to the forward path measured data acquiring unit 984 via the switch 982. The forward path measured data acquiring unit 984 outputs R1(f1), A1(f1), and B1(f2) to the circuit parameter acquiring unit 988.

The input signal (frequency f2) is supplied via the measuring unit 30. On this occasion, the measured result by the receiver (Rch) 18, the measured result by the receiver (Ach) 28, and the measured result by the receiver (Bch) 38 are supplied to the reverse path measured data acquiring unit 986 via the switch 982. The reverse path measured data acquiring unit 986 outputs R2(f2), A2(f1), and B2(f2) to the circuit parameter acquiring unit 988.

The circuit parameter acquiring unit 988 then determines the M parameters: M11$m$, M12$m$, M21$m$, and M22$m$ of the DUT 2 (S204).

The true value circuit parameter acquiring unit 989 finally receives the M parameters: M11$m$, M12$m$, M21$m$, and M22$m$ of the DUT 2 acquired by the circuit parameter acquiring unit 988, Ed1, Er1, Es1, EL2, Ed2, Er2, Es2, and EL1 read out by the measuring system error factor reading out unit 980, and the transmission tracking errors: Et21 and Et12 acquired by the error factor acquiring unit 90, and then acquires the true M parameters: M11, M12, M21, and M22 of the DUT 2 (S206).

According to the present embodiment, in order to acquire the transmission tracking errors Et21 and Et12, there are carried out the processes for acquiring the phase: (1) the calibration tool 6 is connected to the port 4a, and, then, the calibration tool 6 is connected to the port 4b, (2) the port 4a and the port 4b are directly connected with each other, and (3) the calibration mixer 8 is connected to the port 4a and port 4b, the phases of the transmission tracking errors can be acquired, and the errors of the measuring system can be corrected.

It should be noted that, according to the embodiment of the present invention, there is described the case where the network analyzer 1 outputs the input signal, and there are provided two ports (ports 4a and 4b) used to receive the device-under-test signals from the DUT 2. However, there may be three or more of these ports.

Figure 16:
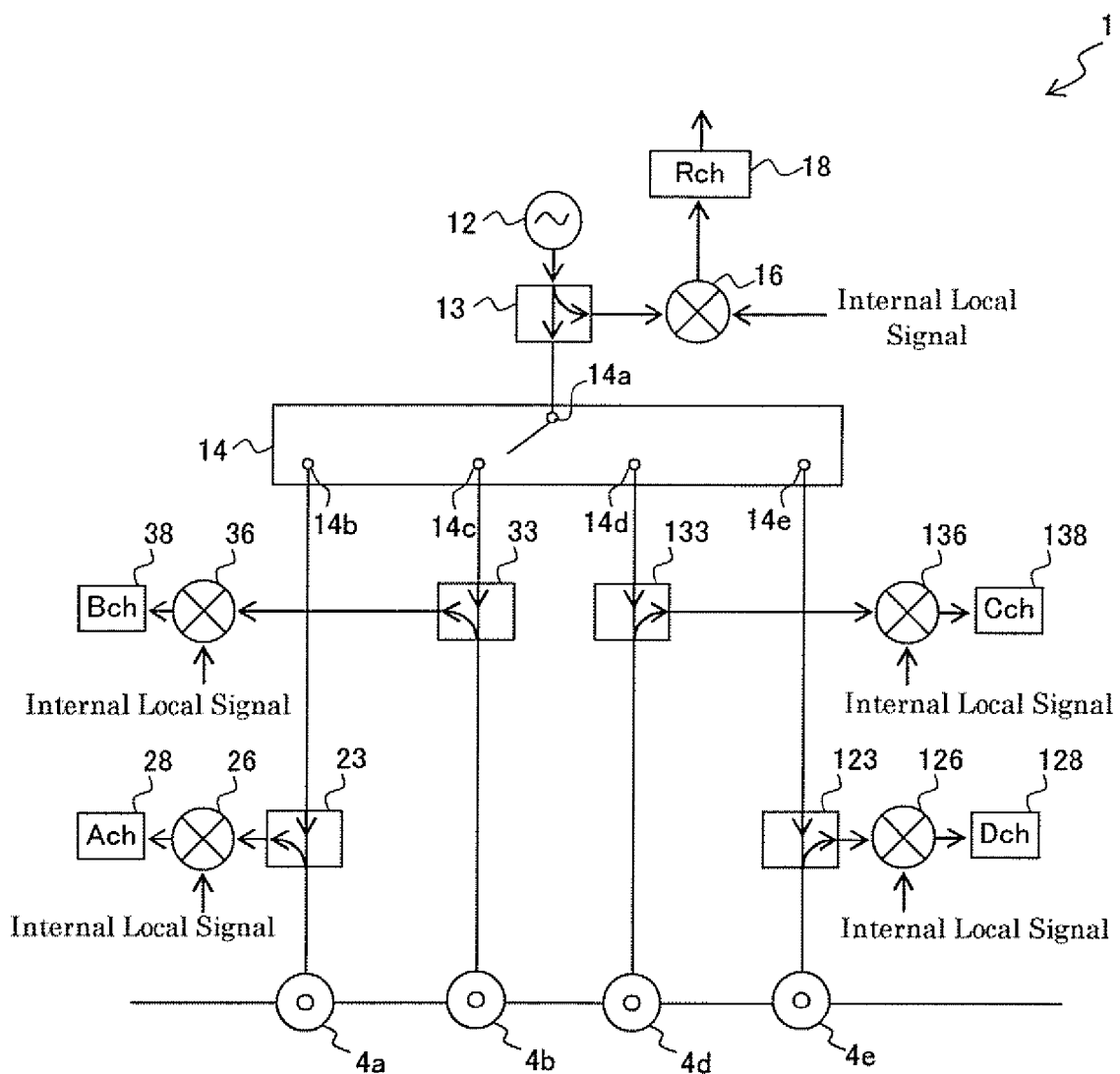
FIG. 16 is a block diagram showing a configuration of a network analyzer 1 according to a (first) variation.

For example, as shown in FIG. 1G, there may be ports 4d and 4e in addition to the ports 4a and 4b. A (first) variation shown in FIG. 16 has such a configuration that the ports 4d and 4e, terminals 14d and 14e of the switch 14, bridges 123 and 133 internal mixers 126 and 136, a receiver (Dch) 128 (device-under-test signal measuring means), and a receiver (Cch) 138 (device-under-test signal measuring means) are added to the network analyzer 1. The other parts remain as described above. It should be noted that, for the sake of illustration, in FIG. 16 are not shown the DUT local signal oscillator 40, the switches 52, 54, and 56, the forward path error factor acquiring unit 60, the reverse path error factor acquiring unit 70, the measuring system error factor recording unit 80, the error factor acquiring unit 90, and the circuit parameter measuring unit 98.

The terminals 14d and 14e of the switch 14 are connected to the bridges 133 and 123.

The bridges 123 and 133 output the signal supplied by the signal source 10 respectively to the ports 4e and 4d. Moreover, the bridges 123 and 133 receive a signal which has been reflected back by the device under test, and a signal which has passed the device under test respectively via the port 4e and 4d, and supply respectively the internal mixers 126 and 136 with the received signals.

The internal mixers 126 and 136 mix the signal supplied respectively from the bridges 123 and 133 with an internal local signal, and respectively output the mixed signal.

The receiver (Dch) 128 and the receiver (Cch) 138 respectively measure the S parameters of the signal output from the internal mixers 126 and 136.

Figure 17:
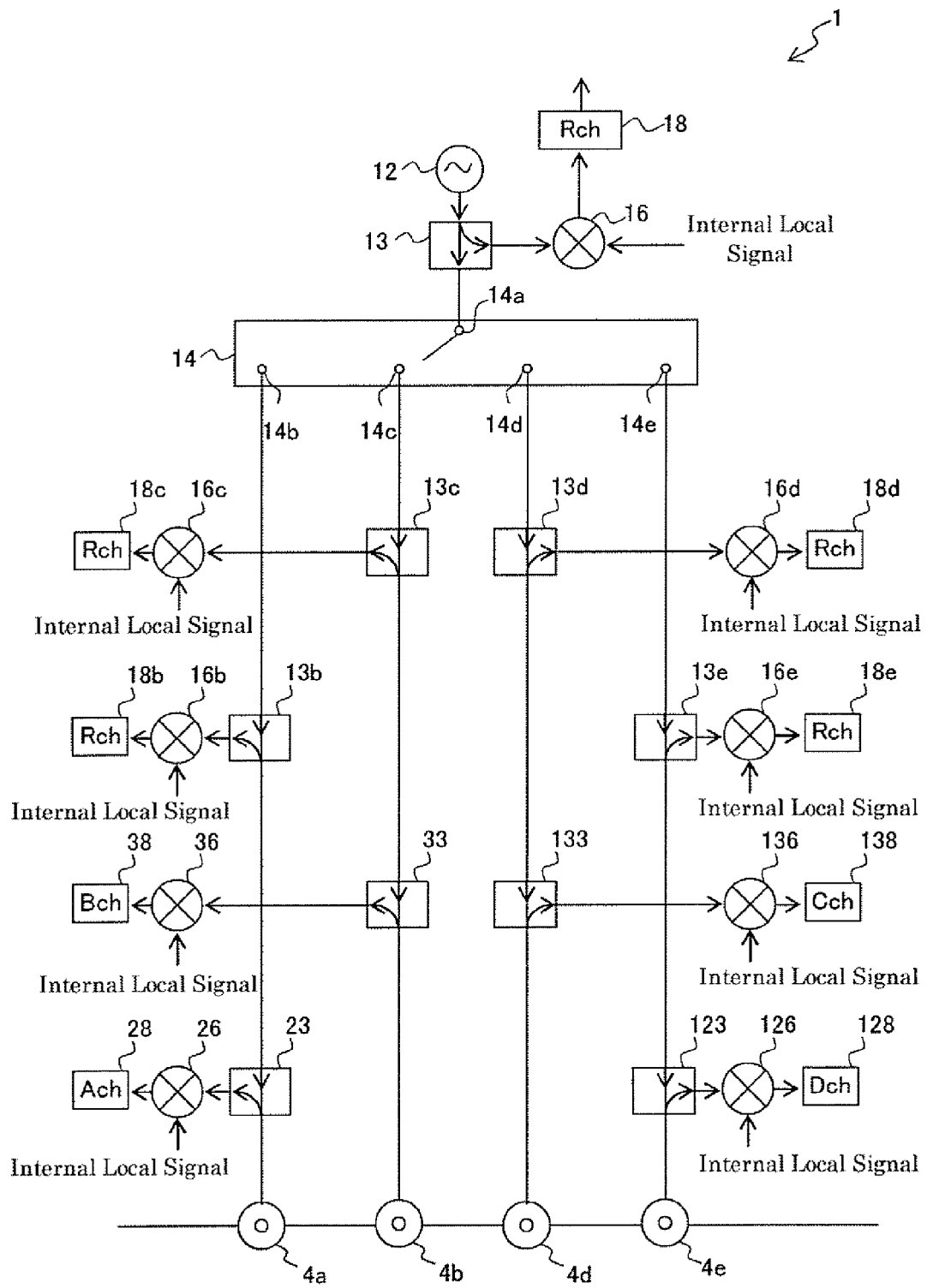
FIG. 17 is a block diagram showing a configuration of a network analyzer 1 according to a (second) variation.

For example, as shown in FIG. 17, there may be ports 4d and 4e in addition to the ports 4a and 4b. A (second) variation shown in FIG. 17 has such a configuration that from the (first) variation shown in FIG. 16 are removed the bridge 13, the internal mixer 16, and the receiver (Rch) 18, and there are added bridges 13b, 13c, 13d, and 13e, internal mixers 16b, 16c, 16d, and 16e, receivers (Rch) 18b, 18e, 18d, and 18e in place of them. It should be noted that, for the sake of illustration, in FIG. 17 are not shown the DUT local signal oscillator 40, the switches 52, 54, and 56, the forward path error factor acquiring unit 60, the reverse path error factor acquiring unit 70, the measuring system error factor recording unit 80, the error factor acquiring unit 90, and the circuit parameter measuring unit 98.

The terminals 14b, 14c, 14d, and 14e of the switch 14 are respectively connected to the bridges 13b, 13c, 13d, and 13e.

The bridges 13b, 13c, 13d, and 13e respectively output a signal supplied from the signal source 10 to the ports 4a, 4b, 4d, and 4e via the bridges 23, 33, 133, and 123. Moreover, the bridges 23, 33, 133, and 123 receive a signal which has been reflected back by the device under test and a signal which has passed the device under test respectively via the ports 4a, 4b, 4d and 4e, and supplie respectively the internal mixers 16b, 16c, 16d, and 16e with the received signals.

The internal mixers 16b, 16c, 16d, and 16e mix the signal supplied by the bridges 13b, 13c, 13d, and 13e with an internal local signal, and output the mixed signals.

The receiver (Rch) 18b, 18c, 18d, and 18e respectively measure the S parameters of the signal output from the internal mixers 16b, 16c, 16d, and 16e.

According to the (second) variation shown in FIG. 17, there hold Es1=EL1, Es2=EL2, ..., and the measurement and arithmetic operation are thus become easier.

Moreover, the above-described embodiment may be realized in the following manner Namely, a computer is provided with a CPU, a hard disk, and a media (such as a floppy disk (registered trade mark) and a CD-ROM) reader, and the media reader is caused to read a medium recording a program realizing the above-described respective parts (such as the forward path error factor acquiring unit 60, the reverse path error factor acquiring unit 70, the measuring system error factor recording unit 80, and the error factor acquiring unit 90), thereby installing the program on the hard disk. This method may also realize the above-described embodiments.

[Proof of Equation 1]

Figure 18:
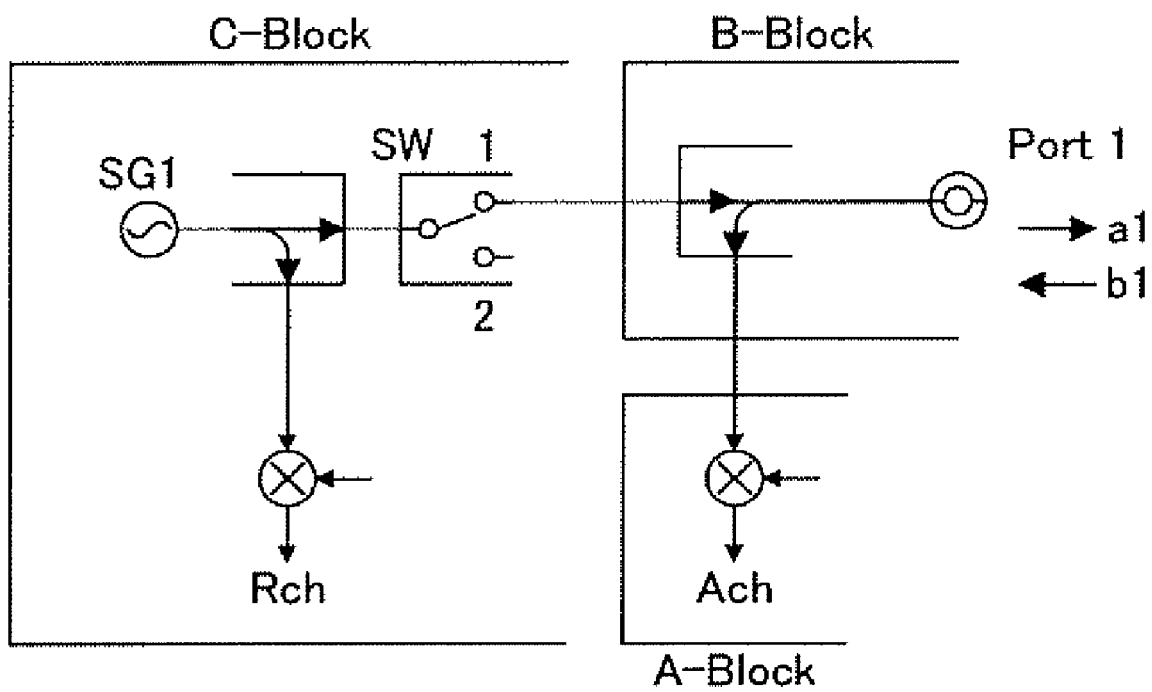
FIG. 18 is a block diagram showing a configuration of the network analyzer 1 referred to prove an equation 1.

A path from SG1 to Port 1 is divided into blocks A, B, and C as shown in FIG. 18. If the SW is switched between 1: an FWD side (the signal is output), and 2: an REV side (the signal is not output), only the state of the C block changes.

On this occasion, if:
the reflection coefficient and the transmission coefficient of the A block are Ax and Ay,
the S parameters of the B block: are Bij (i, j=1, 2, 3),
the reflection coefficient and the transmission coefficient of the C block if the SW is on "1:FWD side" are Cx and Cy, and
the reflection coefficient of the C block if the SW is on "2: REV side" is Cz, an FWD system is represented by a signal flow graph shown in FIG. 19, and an REV system is represented by a signal flow graph shown in FIG. 20.

Figure 19:
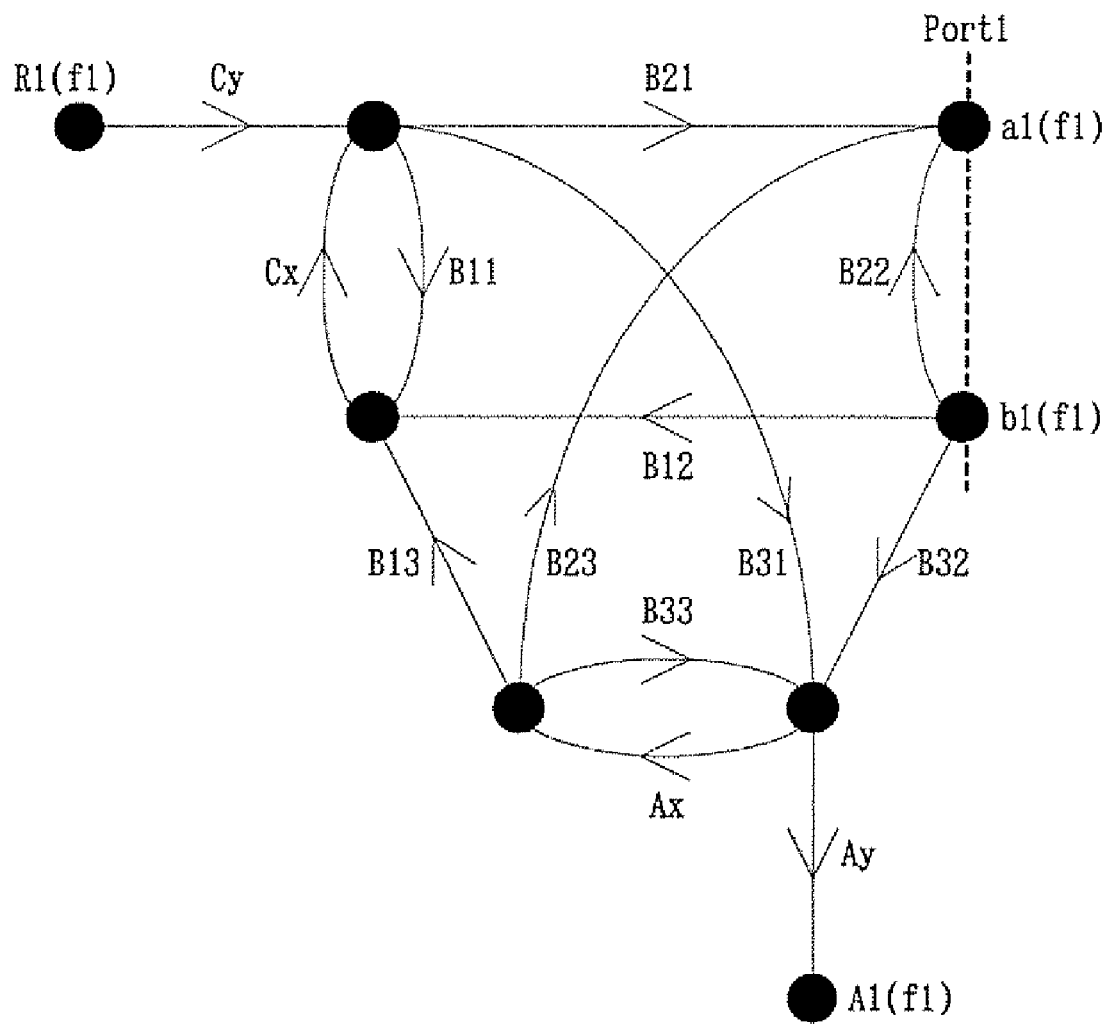
FIG. 19 is a signal flow graph representing a system of a FWD system of the network analyzer 1 shown in FIG. 18.
Figure 20:
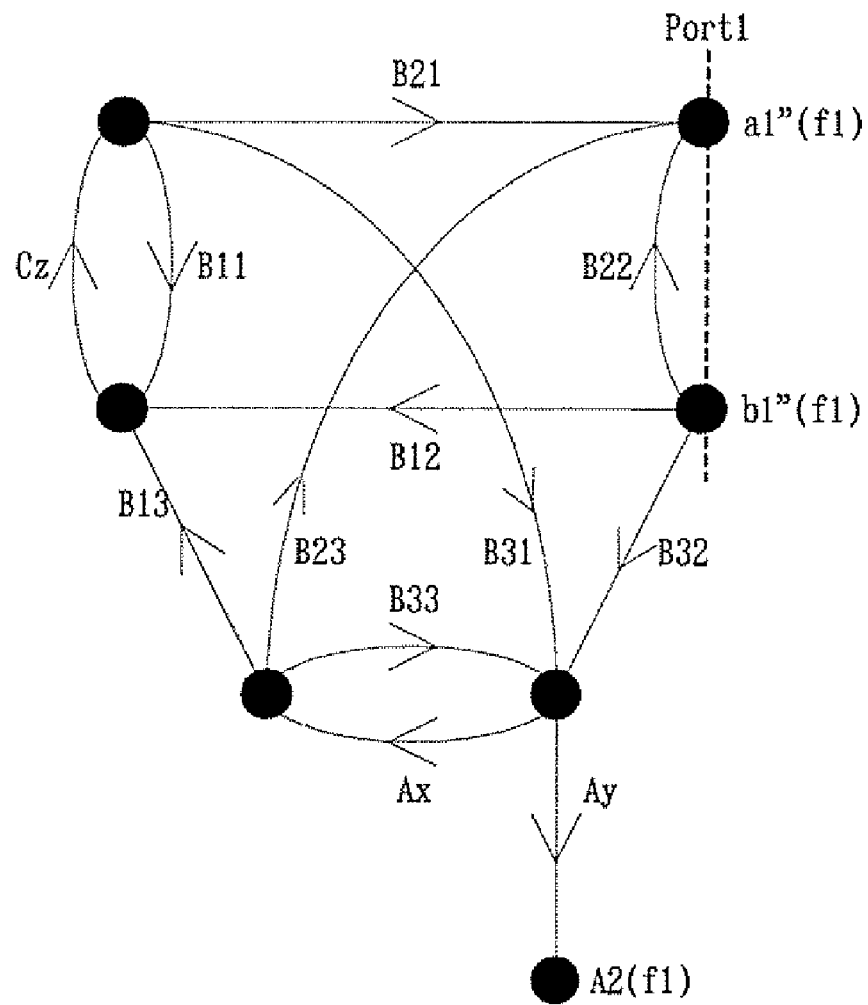
FIG. 20 is a signal flow graph representing a system of a REV system of the network analyzer 1 shown in FIG. 18.
Figure 21:
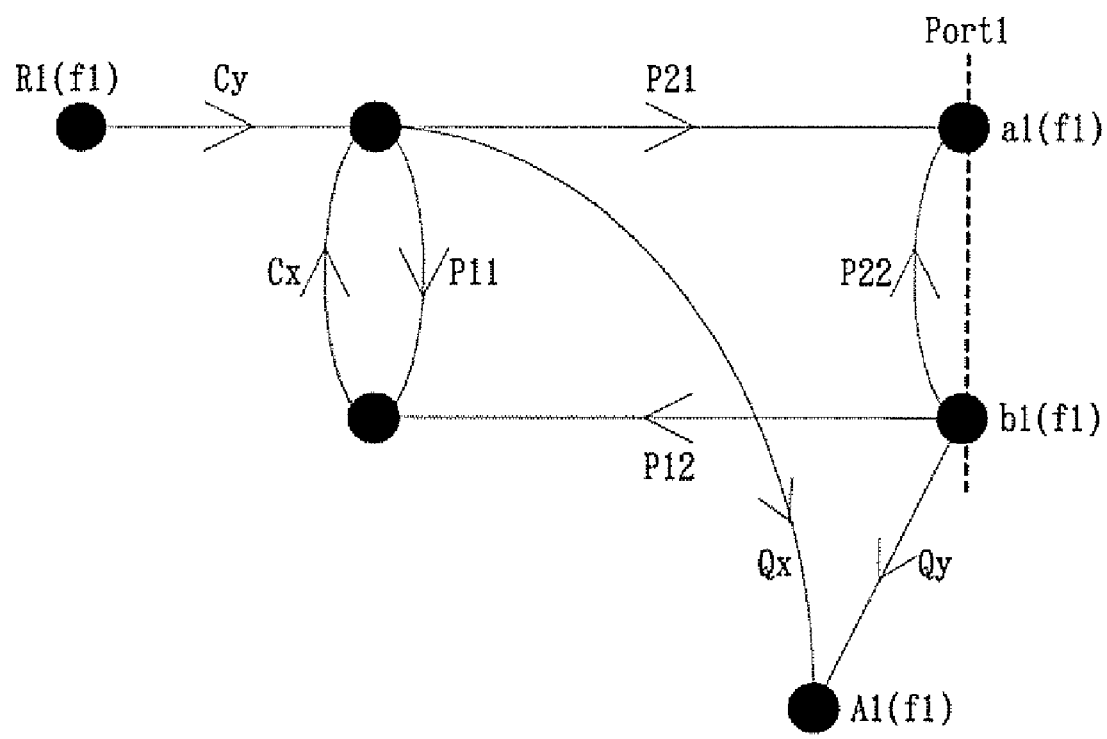
FIG. 21 is a signal flow graph obtained by transforming the signal flow graph shown in FIG. 19.
Figure 22:
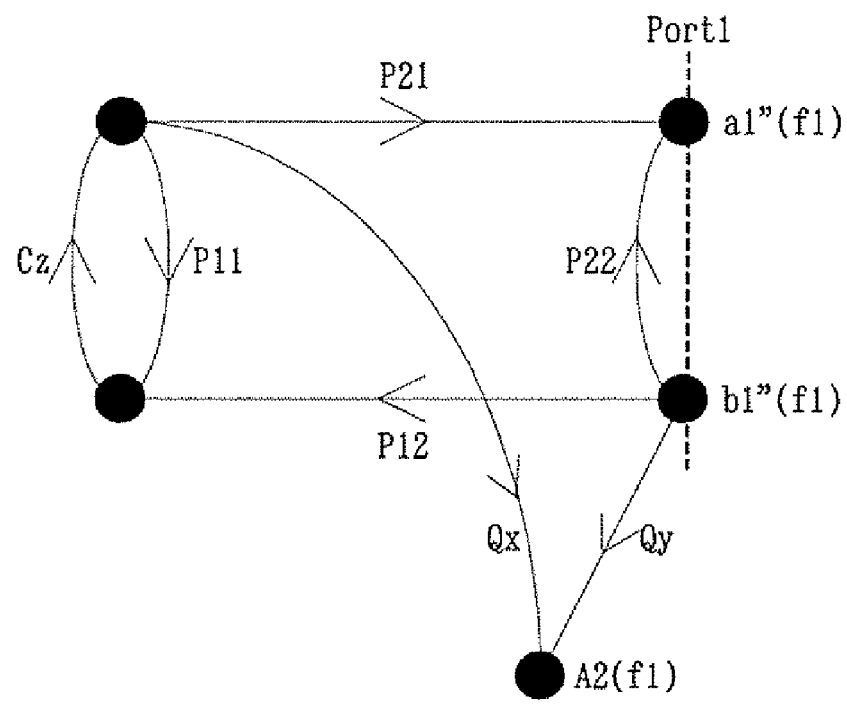
FIG. 22 is a signal flow graph obtained by transforming the signal flow graph shown in FIG. 20.

On this occasion, there are considered only dependencies of the detected values by the receivers and the signals at the Port 1, namely, $$R1(f1), A1(f1), A2(f1), a1(f1), b1(f1), a1''(f1), \text{ and } b1''(f1),$$

by summarizing the variables, the signal flow graph shown in FIG. 19 is transformed into one in FIG. 21, and the signal flow graph shown in FIG. 20 is transformed into one in FIG. 22.

Though P11, P21, P12, P22, Qx, and Qy are respectively functions of Bij (i, j=1, 2, 3), Ax, and Ay, equations which describe these functions are not used in subsequent calculation, and are thus not explicitly described.

Figure 23:
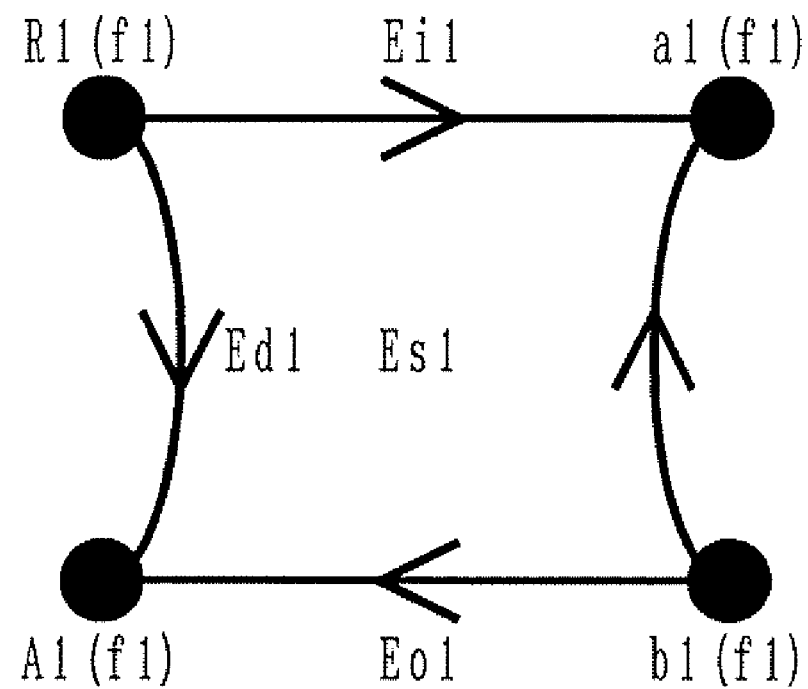
FIG. 23 is a view showing error factors of a measuring system to which the signal flow graph shown in FIG. 21 corresponds.
Figure 24:
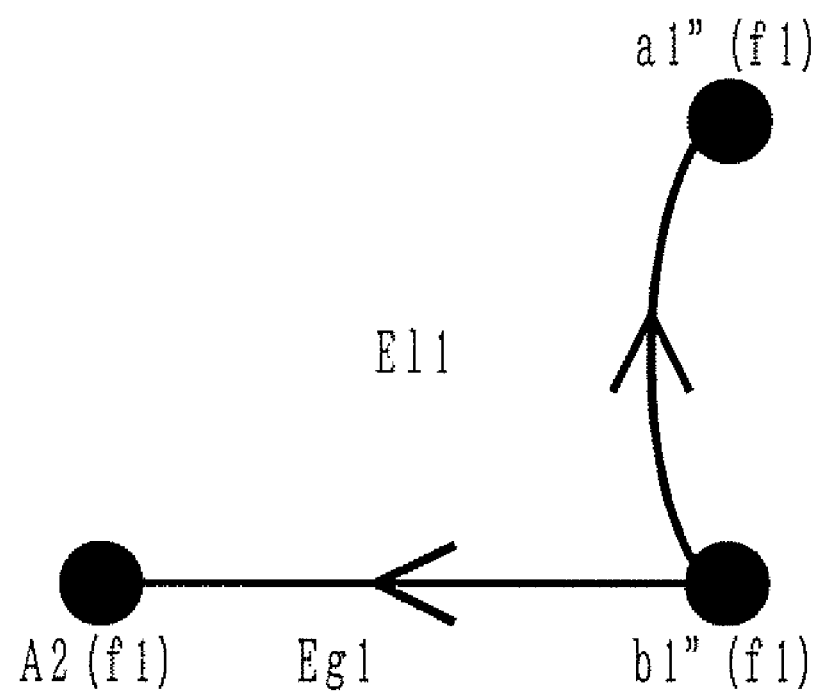
FIG. 24 is a view showing error factors of a measuring system to which the signal flow graph shown in FIG. 22 corresponds.
Figure 25:
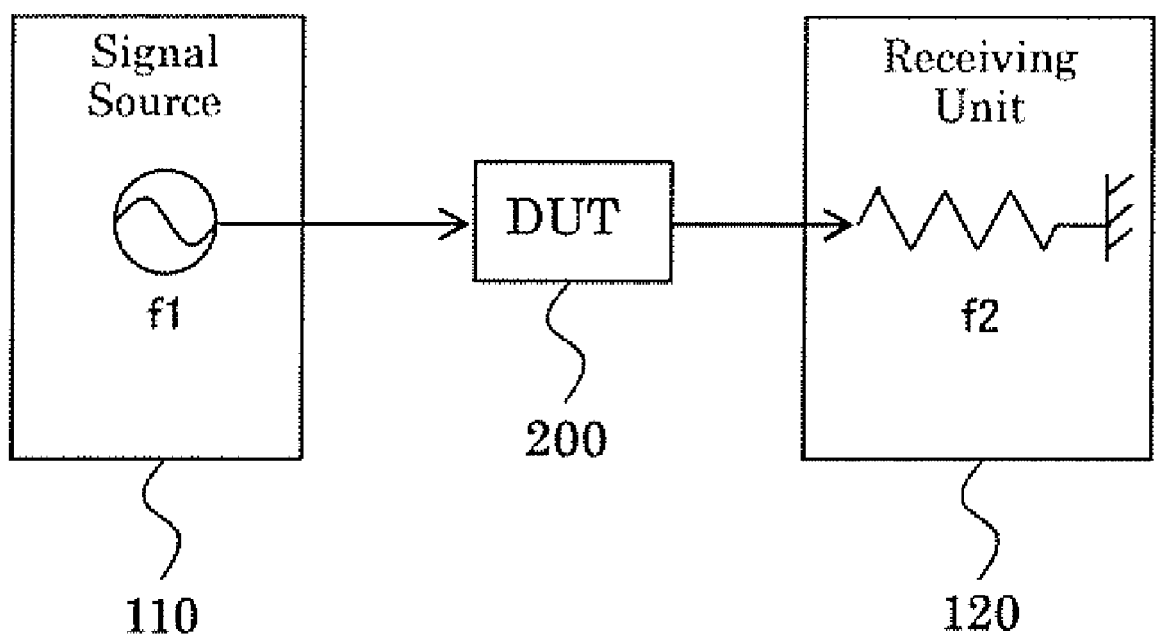
FIG. 25 is a view showing a measurement method of the circuit parameters of a device under test (DUT) according to the prior art.
Figure 26:
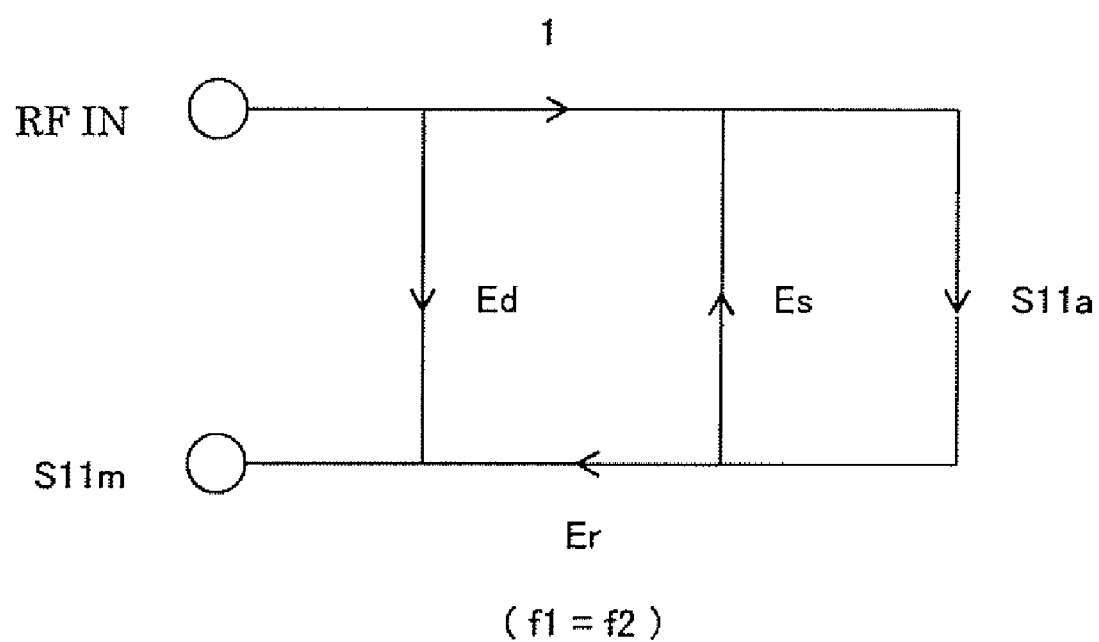
FIG. 26 shows a signal flow graph relating to the signal source 110 if the frequency f1=f2.
Figure 27:
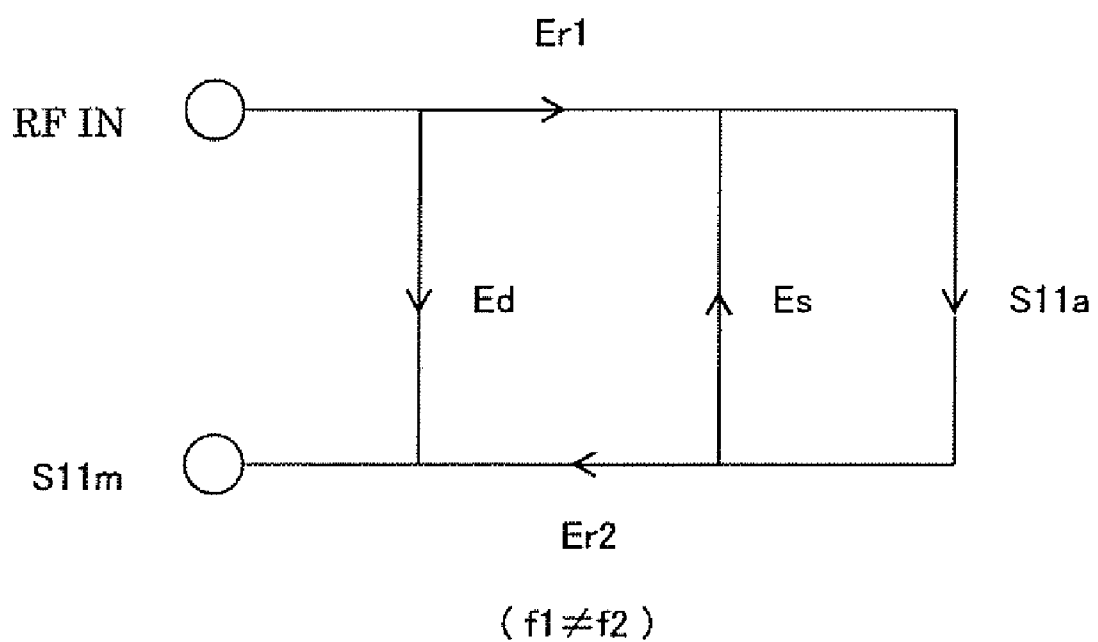
FIG. 27 shows a signal flow graph relating to the signal source 110 if the frequency f1 is not equal to the frequency f2.
Figure 28:
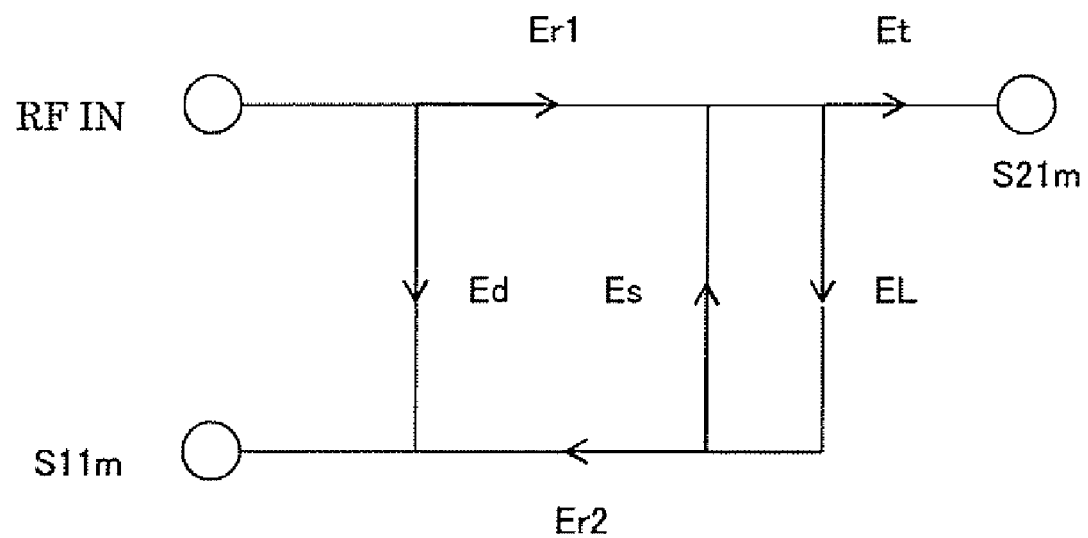
FIG. 28 shows a signal flow graph if the signal source 110 and the receiving unit 120 are directly connected with each other.

The signal flow graph shown in FIG. 21 corresponds to the error factors of the measuring system shown in FIG. 23. The signal flow graph shown in FIG. 22 corresponds to the error factors of the measuring system shown in FIG. 24.

Therefore, the correspondences are represented by the following equations.

FWD: [EQU. 10]

$$Ed_1 = Cy \frac{1}{1 - P_{11}Cx} Qx$$

$$Es_1 = P_{22} + P_{12} \frac{Cx}{1 - P_{11}Cx} P_{21}$$

$$Ei_1 = Cy \frac{1}{1 - P_{11}Cx} P_{21}$$

$$Eo_1 = Qy + P_{12} \frac{Cx}{1 - P_{11}Cx} Qx$$

REV:

$$El_1 = P_{22} + P_{12} \frac{Cz}{1 + P_{11}Cz} P_{21}$$

$$Eg_1 = Qy + P_{12} \frac{Cz}{1 - P_{11}Cz} Qx$$

The equations are thus calculated as follows.

$$Ed_1 \frac{Es_1 - El_1}{El_1} = \ldots = P_{12}Qx \frac{Cx - Cz}{(1 - P_{11}Cx)(1 - P_{11}Cz)}$$ [EQU. 11]

$$Eo_1 - Eg_1 == \ldots = P_{12}Qx \frac{Cx - Cz}{(1 - P_{11}Cx)(1 - P_{11}Cz)}$$

$$\therefore Ed_1 \frac{Es_1 - El_1}{Ei_1} = Eo_1 - Eg_1$$

$$\Leftrightarrow Eg_1 = Eo_1 - Ed_1 \frac{Es_1 - El_1}{Ei_1}$$

$$= \left(1 - Ed_1 \frac{Es_1 - El_1}{Ei_1 Eo_1}\right) Eo_1$$

-continued $$= \left(1 - Ed_1 \frac{Es_1 - El_1}{Er_1}\right) Eo_1$$

$$\therefore Eg_1 = \left(1 - Ed_1 \frac{Es_1 - El_1}{Er_1}\right) Eo_1$$

[End of Proof of Equation 1]

The invention claimed is:

1. A network analyzer comprising:
a measuring system error factor recorder that records a measuring system error factor generated independently of a frequency conversion by a device under test;
a correction coefficient outputter that outputs measured first coefficients and second coefficients of a correction frequency converting element, wherein a signal output from a first terminal of the device under test is represented as a sum of a product of a signal input to the first terminal and a first coefficient and a product of a signal input to a second terminal of the device under test and a second coefficient, a ratio of the magnitudes of the second coefficients is constant, and a frequency of the signal input to the first terminal is different from a frequency of the signal input to the second terminal; and
a transmission tracking error acquirer that acquires a transmission tracking error generated by the frequency conversion based on the measuring system error factor recorded in said measuring system error factor recorder, and the first coefficients and the second coefficients output by said correction coefficient outputter.

2. The network analyzer according to claim 1, wherein if the first coefficients are M11' and M22', the second coefficients are M12' and M21', a signal input to the first terminal is a1, a signal output from the first terminal is b1, a signal input to the second terminal is a2, and a signal output from the second terminal is b2 in said correction frequency converting element, $b1=M11'\times a1+M12'\times a2$ $b2=M21'\times a1+M22'\times a2$, and $|M12'|/|M21'|$ is constant.

3. The network analyzer according to claim 1, wherein the magnitudes of the second coefficients are the same for either of the terminals.

4. The network analyzer according to claim 1 comprising:
an input signal measurer that measures an input signal parameter relating to an input signal input to the device under test before the measuring system error factor is generated;
a plurality of ports that are connected to a terminal of the device under test, including a port that outputs the input signal; and
a device-under-test signal measurer that measures a device-under-test signal parameter relating to a device-under-test signal input from the terminal of the device under test to one of the ports.

5. The network analyzer according to claim 4, wherein said correction coefficient outputter acquires the first coefficients and second coefficients of said correction frequency converting element according to a ratio of the input signal parameter measured by said input signal measurer and the device-under-test signal parameter measured by said device-under-test signal measurer.

6. The network analyzer according to claim 4, wherein said transmission tracking error acquirer acquires the transmission tracking error based on a ratio of error factors generated in a passage from the device-under-test signal being output from a terminal of the device under test without the frequency conversion to the device-under-test signal being received by said device-under-test signal measurer.

7. The network analyzer according to claim 2, wherein the magnitudes of the second coefficients are the same for either of the terminals.

8. The network analyzer according to claim 2 comprising:
an input signal measurer that measures an input signal parameter relating to an input signal input to the device under test before the measuring system error factor is generated;
a plurality of ports that are connected to a terminal of the device under test, including a port that outputs the input signal; and
a device-under-test signal measurer that measures a device-under-test signal parameter relating to a device-under-test signal input from the terminal of the device under test to one of the ports.

9. The network analyzer according to claim 3 comprising:
an input signal measurer that measures an input signal parameter relating to an input signal input to the device under test before the measuring system error factor is generated;
a plurality of ports that are connected to a terminal of the device under test, including a port that outputs the input signal; and
a device-under-test signal measurer that measures a device-under-test signal parameter relating to a device-under-test signal input from the terminal of the device under test to one of the ports.

10. The network analyzer according to claim 7 comprising:
an input signal measurer that measures an input signal parameter relating to an input signal input to the device under test before the measuring system error factor is generated;
a plurality of ports that are connected to a terminal of the device under test, including a port that outputs the input signal; and
a device-under-test signal measurer that measures a device-under-test signal parameter relating to a device-under-test signal input from the terminal of the device under test to one of the ports.

11. The network analyzer according to claim 8, wherein said correction coefficient outputter acquires the first coefficients and second coefficients of said correction frequency converting element according to a ratio of the input signal parameter measured by said input signal measurer and the device-under-test signal parameter measured by said device-under-test signal measurer.

12. The network analyzer according to claim 9, wherein said correction coefficient outputter acquires the first coefficients and second coefficients of said correction frequency converting element according to a ratio of the input signal parameter measured by said input signal measurer and the device-under-test signal parameter measured by said device-under-test signal measurer.

13. The network analyzer according to claim 10, wherein said correction coefficient outputter acquires the first coefficients and second coefficients of said correction frequency converting element according to a ratio of the input signal parameter measured by said input signal measurer and the device-under-test signal parameter measured by said device-under-test signal measurer.

14. The network analyzer according to claim 8, wherein said transmission tracking error acquirer acquires the transmission tracking error based on a ratio of error factors generated in a passage from the device-under-test signal being output from a terminal of the device under test without the frequency conversion to the device-under-test signal being received by said device-under-test signal measurer.

15. The network analyzer according to claim 9, wherein said transmission tracking error acquirer acquires the transmission tracking error based on a ratio of error factors generated in a passage from the device-under-test signal being output from a terminal of the device under test without the frequency conversion to the device-under-test signal being received by said device-under-test signal measurer.

16. The network analyzer according to claim 10, wherein said transmission tracking error acquirer acquires the transmission tracking error based on a ratio of error factors generated in a passage from the device-under-test signal being output from a terminal of the device under test without the frequency conversion to the device-under-test signal being received by said device-under-test signal measurer.

17. A network analyzing method comprising:

recording a measuring system error factor generated independently of a frequency conversion by a device under test;

outputting measured first coefficients and second coefficients of a correction frequency converting element, wherein a signal output from a first terminal is represented as a sum of a product of a signal input to the first terminal and the first coefficient and a product of a signal input to a second terminal and the second coefficient, a ratio of the magnitudes of the second coefficients is constant, and a frequency of the signal input to the first terminal is different from a frequency of the signal input to the second terminal; and acquiring a transmission tracking error generated by the frequency conversion based on the measuring system error factor and the first coefficients and the second coefficients.

18. A program of instructions for execution by a computer to perform processing for analyzing a network, said processing comprising:

recording a measuring system error factor generated independently of a frequency conversion by a device under test;

outputting measured first coefficients and second coefficients of a correction frequency converting element, wherein a signal output from a first terminal is represented as a sum of a product of a signal input to the first terminal and the first coefficient and a product of a signal input to a second terminal and the second coefficient, a ratio of the magnitudes of the second coefficients is constant, and a frequency of the signal input to the first terminal is different from a frequency of the signal input to the second terminal; and acquiring a transmission tracking error generated by the frequency conversion based on the measuring system error factor and the first coefficients and the second coefficients.

19. A computer-readable medium having a program of instructions for execution by a computer to perform processing for analyzing a network, said processing comprising:

recording a measuring system error factor generated independently of a frequency conversion by a device under test;

outputting measured first coefficients and second coefficients of a correction frequency converting element, wherein a signal output from a first terminal is represented as a sum of a product of a signal input to the first terminal and the first coefficient and a product of a signal input to a second terminal and the second coefficient, and a ratio of the magnitudes of the second coefficients is constant, and a frequency of the signal input to the first terminal is different from a frequency of the signal input to the second terminal; and acquiring a transmission tracking error generated by the frequency conversion based on the measuring system error factor and the first coefficients and the second coefficients.

* * * * *

UNITED STATES PATENT AND TRADEMARK OFFICE
CERTIFICATE OF CORRECTION

| | | |
|---|---|---|
| PATENT NO. | : 7,561,987 B2 | |
| APPLICATION NO. | : 10/598201 | |
| DATED | : July 14, 2009 | |
| INVENTOR(S) | : Yoshikazu Nakayama et al. | |

It is certified that error appears in the above-identified patent and that said Letters Patent is hereby corrected as shown below:

ON THE TITLE PAGE at (56) Other Publications:

"JP WO/087856A1" should read --WO 03/087856A1--.

COLUMN 1:

Line 34, "Slim" should read --S11m--;

Line 37, "S 1a" should read --S11a--.

COLUMN 3:

Line 66, "fist" should read --first--.

COLUMN 7:

Line 1, "unit f2" should read --unit 12--.

COLUMN 12:

Line 43, "that" should read --that ""--.

UNITED STATES PATENT AND TRADEMARK OFFICE
CERTIFICATE OF CORRECTION

PATENT NO. : 7,561,987 B2
APPLICATION NO. : 10/598201
DATED : July 14, 2009
INVENTOR(S) : Yoshikazu Nakayama et al.

It is certified that error appears in the above-identified patent and that said Letters Patent is hereby corrected as shown below:

COLUMN 18:

Line 48, " $E1_1 = P_{22} + P_{12} \dfrac{C_z}{1 + P_{11}C_z} P_{21}$ " should read -- $E1_1 = P_{22} + P_{12} \dfrac{C_z}{1 - P_{11}C_z} P_{21}$ --.

Signed and Sealed this

Tenth Day of November, 2009

David J. Kappos
*Director of the United States Patent and Trademark Office*